United States Patent
Huang et al.

(10) Patent No.: US 11,373,956 B2
(45) Date of Patent: Jun. 28, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Min Lung Huang, Kaohsiung (TW); Hung-Jung Tu, Kaohsiung (TW); Hsin Hsiang Wang, Kaohsiung (TW); Chih-Wei Huang, Kaohsiung (TW); Shiuan-Yu Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 116 days.

(21) Appl. No.: 16/742,788

(22) Filed: Jan. 14, 2020

(65) Prior Publication Data

US 2021/0217701 A1     Jul. 15, 2021

(51) Int. Cl.
| | |
|---|---|
| *H01L 23/538* | (2006.01) |
| *H01L 23/31* | (2006.01) |
| *H01L 21/768* | (2006.01) |
| *H01L 23/00* | (2006.01) |
| *H01L 23/528* | (2006.01) |

(52) U.S. Cl.
CPC .... *H01L 23/5389* (2013.01); *H01L 21/76885* (2013.01); *H01L 23/3107* (2013.01); *H01L 23/528* (2013.01); *H01L 24/33* (2013.01)

(58) Field of Classification Search
CPC ............. H01L 23/5389; H01L 23/3107; H01L 23/528; H01L 21/76885
See application file for complete search history.

(56) References Cited

U.S. PATENT DOCUMENTS

| | | | |
|---|---|---|---|
| 6,376,904 B1* | 4/2002 | Haba | H01L 23/3128 257/691 |
| 8,970,046 B2 | 3/2015 | Kim et al. | |
| 2005/0139985 A1* | 6/2005 | Takahashi | H01L 25/0657 257/E23.146 |
| 2008/0111230 A1 | 5/2008 | Kim et al. | |
| 2009/0065948 A1* | 3/2009 | Wang | H01L 25/0657 257/777 |
| 2011/0272825 A1* | 11/2011 | McGrath | H01L 21/563 257/777 |
| 2019/0074261 A1 | 3/2019 | Yu et al. | |

* cited by examiner

*Primary Examiner* — Marc Anthony Armand
(74) *Attorney, Agent, or Firm* — Foley & Lardner LLP

(57) ABSTRACT

The present disclosure provides a semiconductor device package. The semiconductor device package includes a first semiconductor device, a first conductive layer and a second conductive layer. The first semiconductor device has a first conductive pad. The first conductive layer is disposed in direct contact with the first conductive pad. The first conductive layer extends along a direction substantially parallel to a surface of the first conductive pad. The second conductive layer is disposed in direct contact with the first conductive pad and spaced apart from the first conductive layer.

20 Claims, 29 Drawing Sheets

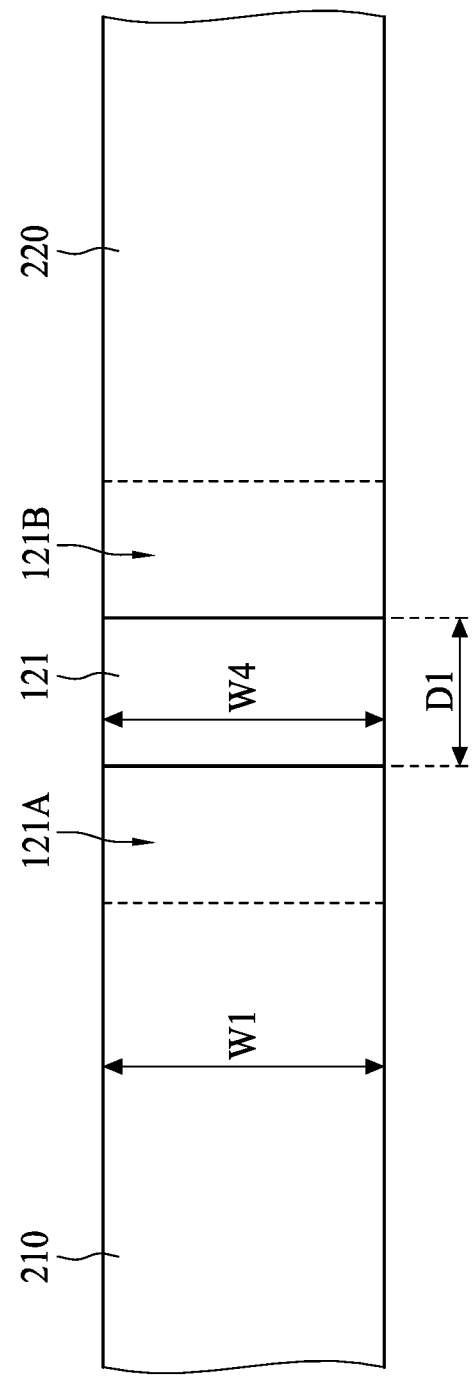

SEMICONDUCTOR DEVICE PACKAGE AND METHOD OF MANUFACTURING THE SAME

TECHNICAL FIELD

The present disclosure generally relates to a semiconductor device package and a method of manufacturing the same, and to a semiconductor device package having a conductive layer and a method of manufacturing the same.

DESCRIPTION OF THE RELATED ART

A semiconductor device package can have one or more semiconductor devices disposed on a carrier and encapsulated by an encapsulant. In order to improve performance of the semiconductor device package, some semiconductor devices can be stacked in the semiconductor device package, which can minimize device footprint on the carrier to ease future miniaturization.

SUMMARY

In one or more embodiments, a semiconductor device package includes a first semiconductor device, a first conductive layer and a second conductive layer. The first semiconductor device has a first conductive pad. The first conductive layer is disposed in direct contact with the first conductive pad. The first conductive layer extends along a direction substantially parallel to a surface of the first conductive pad. The second conductive layer is disposed in direct contact with the first conductive pad and spaced apart from the first conductive layer.

In one or more embodiments, a semiconductor device package includes a first semiconductor device, a second semiconductor device and a first conductive layer. The first semiconductor device has a first surface. The second semiconductor device is stacked on the first semiconductor device. The second semiconductor device has a first surface substantially perpendicular to the first surface of the first semiconductor device and a second surface substantially parallel to the first surface of the first semiconductor device. The first conductive layer is disposed in direct contact with the first surface of the first semiconductor device, the first surface of the second semiconductor device, and the second surface of the second semiconductor device.

In one or more embodiments, a method for manufacturing a semiconductor device package includes providing a first semiconductor device. The first semiconductor device has a first conductive pad. The method further includes stacking a second semiconductor device on the first semiconductor device. The method further includes forming an insulation material on the first semiconductor device and the second semiconductor device. The method further includes partially removing the insulation material to form a supporting structure in a corner. The corner is defined by a portion of a surface of the first semiconductor device and a portion of a surface of the second semiconductor device. The method further includes forming a first conductive layer and a second conductive layer both directly contacting the first conductive pad and spaced apart from each other.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 3C illustrates an enlarged top view of a portion of a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
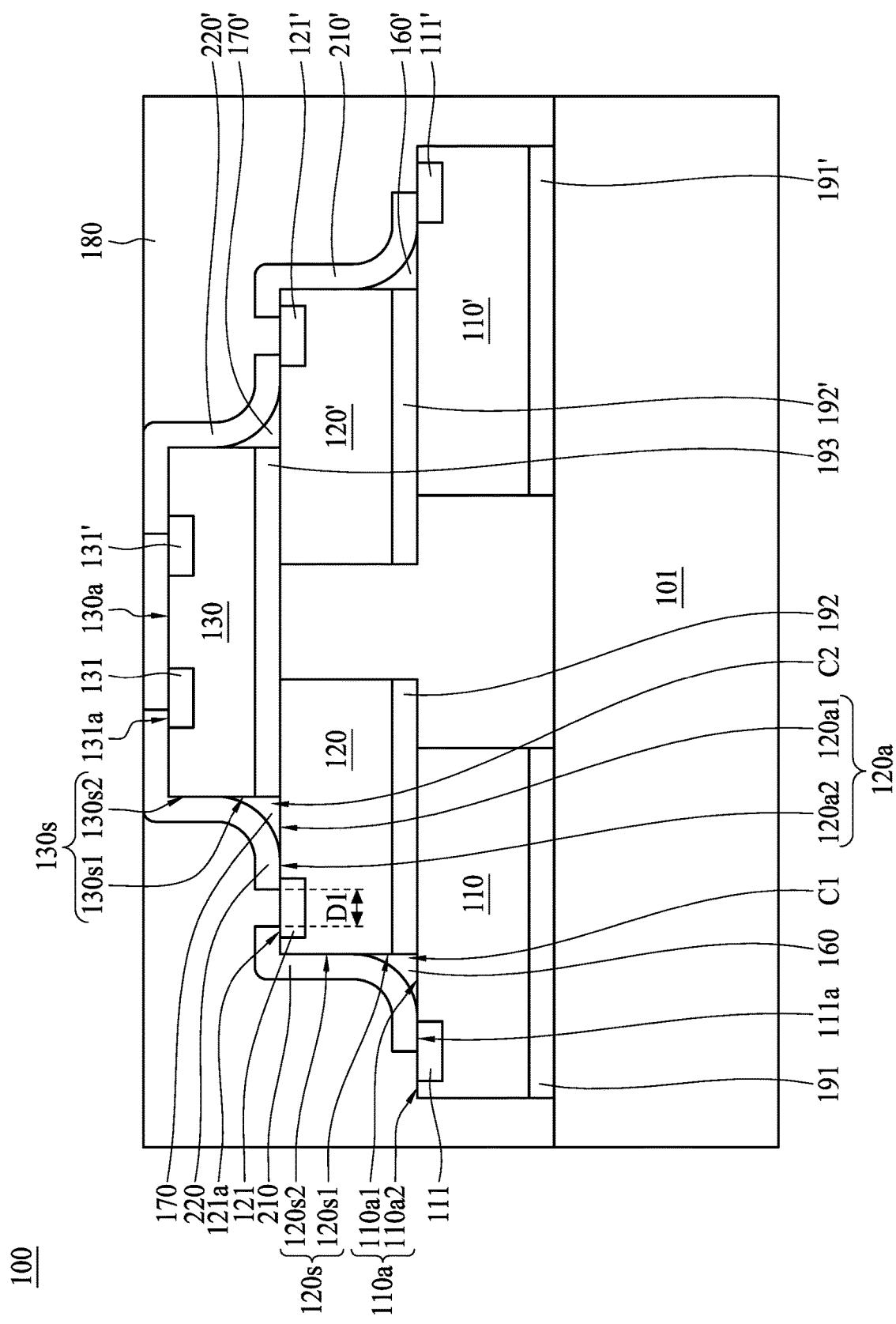
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 100 in accordance with some embodiments of the present disclosure. The semiconductor device package 100 may include a semiconductor device 110, a semiconductor device 120, a semiconductor device 130, a conductive layer 210, a conductive layer 220, a supporting structure 160, a supporting structure 170 and an encapsulation layer 180.

The semiconductor device 110 may have a surface 110a (which may also be referred to as "an upper surface"). The semiconductor device 110 may have a conductive pad 111. The semiconductor device 110 may be attached to a carrier 101 through an adhesive layer 191. The carrier 101 may include, for example but not limited thereto, a molding compound, bismaleimide triazine (BT), polyimide (PI), polybenzoxazole (PBO), a solder resist, an Ajinomoto build-up film (ABF), polypropylene (PP), an epoxy-based material, or a combination of two or more thereof. The carrier 101 may include an interconnection structure, such as a redistribution layer (RDL) or a grounding element. The carrier 101 may include one or more conductive pads in proximity to, adjacent to, or embedded in and exposed at a surface of the carrier 101. The carrier 101 may include a solder resist (or solder mask) on a surface of the carrier 101 to fully expose or to expose at least a portion of the conductive pads for electrical connections.

The semiconductor device 120 may be stacked on the semiconductor device 110. The semiconductor device 120 may be attached to the semiconductor device 110 through an adhesive layer 192. The semiconductor device 120 may have a surface 120s (which may also be referred to as "a lateral surface") substantially perpendicular to the surface 110a of the semiconductor device 110. The semiconductor device 120 may have a surface 120a (which may also be referred to as "an upper surface") substantially parallel to the surface 110a of the semiconductor device 110. The semiconductor device 120 may have a conductive pad 121.

The semiconductor device 130 may be stacked on the semiconductor device 120. The semiconductor device 130 may be attached to the semiconductor device 120 through an adhesive layer 193. The semiconductor device 130 may have a surface 130a (which may also be referred to as "an upper surface") and a surface 130s (which may also be referred to as "a lateral surface") substantially perpendicular to the surface 130a. In some embodiments, the surface 130s of the semiconductor device 130 may be substantially perpendicular to the surface 120a of the semiconductor device 120. In some embodiments, the surface 130a of the semiconductor device 130 may be substantially parallel to the surface 120a of the semiconductor device 120. The semiconductor device 130 may have a conductive pad 131.

Each of the semiconductor devices 110, 120, and 130 may include a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. In some embodiments, a height of the semiconductor devices 110, 120, and/or 130 may be in a range from about 100 µm to about 300 µm.

The conductive layer 210 may electrically connect the semiconductor device 110 to the semiconductor device 120. The conductive layer 210 may be disposed in direct contact with the conductive pad 111 of the semiconductor device 110. The conductive layer 210 may extend along a direction substantially parallel to a surface 111a (which may also be referred to as "an upper surface") of the conductive pad 111. The conductive layer 210 may extend onto and directly contact a portion of the surface 111a of the conductive pad 111. The conductive layer 210 may be disposed in direct contact with the conductive pad 121 of the semiconductor device 120. The conductive layer 210 may extend along a direction substantially parallel to a surface 121a (which may also be referred to as "an upper surface") of the conductive pad 121. The conductive layer 210 may extend on and directly contact a portion of the surface 121a of the conductive pad 121. The conductive layer 210 may be disposed in direct contact with the surface 110a of the semiconductor device 110, the surface 120s of the semiconductor device 120 and the surface 120a of the semiconductor device 120. In some embodiments, the conductive layer 210 may have a slanted surface. In some embodiments, the conductive layer 210 may have a curved surface. In some embodiments, a thickness of the conductive layer 210 may be in a range from about 7 µm to about 15 µm.

The conductive layer 220 may electrically connect the semiconductor device 120 to the semiconductor device 130. The conductive layer 220 may be spaced apart from the conductive layer 210. In some embodiments, the conductive layer 220 may be spaced apart from the conductive layer 210 by a distance D1 of at least 20 µm, at least 30 µm, at least 40 µm or at least 50 µm. The conductive layer 220 may be disposed in direct contact with the conductive pad 121 of the semiconductor device 120. The conductive layer 220 may extend along a direction substantially parallel to a surface 121a of the conductive pad 121. The conductive layer 220 may extend onto and directly contact a portion of the surface 121a of the conductive pad 121. The conductive layer 220 may be disposed in direct contact with the surface 120a of the semiconductor device 120. The conductive layer 220 may be disposed in direct contact with the conductive pad 131 of the semiconductor device 130. The conductive layer 220 may extend along a direction substantially parallel to a surface 131a (which may also be referred to as "an upper surface") of the conductive pad 131. The conductive layer 220 may extend onto and directly contact a portion of the surface 131a of the conductive pad 131. The conductive layer 220 may be disposed in direct contact with the surface 130s of the semiconductor device 130. The conductive layer 220 may be in direct contact with the surface 130a of the semiconductor device 130. In some embodiments, the conductive layer 220 may have a slanted surface. In some embodiments, the conductive layer 220 may have a curved surface. In some embodiments, a thickness of the conductive layer 220 may be in a range from about 7 µm to about 15 µm.

In some embodiments, the conductive layer 210 and/or the conductive layer 220 may include, for example but not limited thereto, aluminum (Al), gold (Au), silver (Ag), copper (Cu), platinum (Pt), palladium (Pd), other metal(s) or alloy(s), or a combination of two or more thereof.

Stacked semiconductor devices are usually electrically connected through wire bonding or by conductive pillars. An encapsulation layer is then formed to cover the semiconductor devices and the wires and/or the pillars. The wires and/or pillars have a relatively great length. The relatively long wires and/or pillars can be damaged during the operation of encapsulation (e.g., the wires and/or pillars may be broken by a relatively strong molding flow), which may greatly increase the difficulty as well as the manufacturing cost of the rework process of the wires and/or pillars. In contrast, with the design of the conductive layers 210 and 220 in accordance with some embodiments of the present disclosure, the length of each of the conductive layers 210 and 220 can be relatively short. Therefore, the damage of the conductive layer 210 and/or the conductive layer 220 caused by the relatively strong molding flow can be avoided. Thus, the difficulty as well as the manufacturing cost of the rework process of the conductive layer 210 and/or the conductive layer 220 can be significantly reduced, and the yield and reliability of the semiconductor device package 100 can be increased.

In addition, in the manufacturing process of a semiconductor device package, defects may be found in the semiconductor devices, and abnormalities may occur in the formation process of the conductive layer(s), which may increase the difficulty and the manufacturing cost of the rework process of the semiconductor device package. With the design of the conductive layers 210 and 220 in accordance with some embodiments of the present disclosure, the conductive layer 210 and the conductive layer 220 can be relatively short in length and can electrically connect the semiconductor device 120 to the semiconductor device 110 and the semiconductor device 130, respectively. Accordingly, the semiconductor devices 110, 120 and 130 can be electrically connected through a conductive structure including separated relatively short conductive segments (e.g., conductive layers 210 and 220), the chance of damage of the whole conductive structure can be reduced significantly, and hence the damage of part of these conductive segments (e.g., the conductive layer 210 or the conductive layer 220) can require fewer components (e.g., fewer pieces of the semiconductor devices) to be reworked. Thus, the difficulty and the manufacturing cost of the rework process of the semiconductor device package 100 can be significantly reduced, and the manufacturing yield of the semiconductor device package 100 can be significantly increased.

Moreover, with the design of the conductive layers 210 and 220 in accordance with some embodiments of the present disclosure, different semiconductor devices (e.g., semiconductor devices 110, 120 and 130) can be electrically connected to different signal sources through different conductive layers, which can provide greater design flexibility and more device applications. Furthermore, the relatively short conductive layers 210 and 220 can reduce undesired electrical interferences (e.g., inductance effect when the package is working at a relatively high frequency) and thus can provide an improved electrical performance, and a relatively smaller elevational space can be occupied.

The supporting structure 160 may be disposed on the semiconductor device 110. A portion 110a1 of the surface 110a of the semiconductor device 110 and a portion 120s1 of the surface 120s of the semiconductor device 120 may define a corner C1. The supporting structure 160 may be disposed in the corner C1.

The supporting structure 160 may be disposed in direct contact with the surface 120s of the semiconductor device 120. The supporting structure 160 may be in direct contact with the portion 110a1 of the surface 110a of the semiconductor device 110. The supporting structure 160 may be in direct contact with the portion 120s1 of the surface 120s of the semiconductor device 120. The conductive layer 210 may be disposed in direct contact with the supporting structure 160. The conductive layer 210 may be in direct contact with a portion 110a1 of the surface 110a of the semiconductor device 110. The conductive layer 210 may be in direct contact with a portion 120s2 of the surface 120s of the semiconductor device 120. In some embodiments, an interface between the supporting structure 160 and the semiconductor device 120 and an interface between the conductive layer 210 and the semiconductor device 120 may be continuous. In some embodiments, the supporting structure 160 may have a sloped concave surface. The conductive layer 210 may be in direct contact with the sloped concave surface of the supporting structure 160. In some embodiments, a thickness of the conductive layer 210 at the corner C1 may be in a range from about 10 μm to about 13 μm.

The supporting structure 170 may be disposed on the semiconductor device 120. A portion 120a1 of the surface 120a of the semiconductor device 120 and a portion 130s1 of the surface 130s of the semiconductor device 130 may define a corner C2. The supporting structure 170 may be disposed in the corner C2.

The supporting structure 170 may be disposed in direct contact with the surface 130s of the semiconductor device 130. The supporting structure 170 may be in direct contact with the portion 120a1 of the surface 120a of the semiconductor device 120. The supporting structure 170 may be in direct contact with the portion 130s1 of the surface 130s of the semiconductor device 130. The conductive layer 220 may be disposed in direct contact with the supporting structure 170. The conductive layer 220 may be in direct contact with a portion 120a2 of the surface 120a of the semiconductor device 120. The conductive layer 220 may be in direct contact with a portion 130s2 of the surface 130s of the semiconductor device 130. In some embodiments, an interface between the supporting structure 170 and the semiconductor device 130 and an interface between the conductive layer 220 and the semiconductor device 130 may be continuous. In some embodiments, the supporting structure 170 may have a sloped concave surface. The conductive layer 220 may be in direct contact with the sloped concave surface of the supporting structure 170. In some embodiments, a thickness of the conductive layer 220 at the corner C2 may be in a range from about 10 μm to about 13 μm.

In some embodiments, the supporting structure 160 and/or the supporting structure 170 may include, for example but not limited thereto, an ABF, polyimide (PI), an epoxy-based material, or a combination of two or more thereof.

When a conductive layer having a relatively small thickness (e.g., equal to or less than 15 μm) is formed in a corner defined by two surfaces substantially perpendicular to each other, the portion of the conductive layer in the corner may easily crack or break due to the relatively sharp angle defined by the two surfaces of the corner. In accordance with some embodiments of the present disclosure, the conductive layer (e.g., conductive layer 210 and/or conductive layer 220) may be formed on the supporting structure (e.g., the supporting structure 160 and/or the supporting structure 170) disposed in the corner (e.g., the corner C1 and/or the corner C2), thus the conductive layer can be raised up and supported by the supporting structure at the corner, and the angle of the conductive layer at the corner can be smoothed. Accordingly, the cracking or breaking issues of conductive layer(s) formed at the corner(s) having sharp angles can be avoided, and the reliability of the conductive layer(s) can be improved.

The encapsulation layer 180 may be disposed on the semiconductor device 110, the semiconductor device 120, the semiconductor device 130, the conductive layer 210 and conductive layer 220. The encapsulation layer 180 may be in direct contact with the conductive pad 111 of the semiconductor device 110. The encapsulation layer 180 may be in direct contact with the conductive pad 121 of the semiconductor device 120. The encapsulation layer 180 may be in direct contact with the conductive pad 131 of the semiconductor device 130. In some embodiments, the encapsulation layer 180 may include, for example, but is not limited to, an epoxy resin having fillers, a molding compound (e.g., an epoxy molding compound or other molding compounds), polyimide, a phenolic compound or material, a material with a silicone dispersed therein, or a combination thereof.

In accordance with some embodiments of the present disclosure, as illustrated in FIG. 1, the semiconductor device package 100 may further include semiconductor devices 110' and 120', supporting structures 160' and 170' and conductive layers 210' and 220'. The semiconductor device 110' may have a conductive pad 111'. The semiconductor device 120' may have a conductive pad 121'. The semiconductor device 130 may further have a conductive pad 131'. The semiconductor device 110' may be attached to the carrier 101 through an adhesive layer 191'. The semiconductor device 120' may be attached to the semiconductor device 110' through an adhesive layer 192'. The semiconductor device 120' may be attached to the semiconductor device 130 through the adhesive layer 193. The semiconductor device 130 may be stacked on the semiconductor devices 120 and 120'. The conductive layer 220' may be spaced apart from the conductive layer 210' above the semiconductor device 120'. The conductive layer 210' and the conductive layer 220' may directly contact the conductive pad 121' of the semiconductor device 120. The conductive layer 220' may directly contact the conductive pad 131' of the semiconductor device 130. The conductive layer 210' may directly contact the conductive pad 111' of the semiconductor device 110. In some embodiments, as shown in FIG. 1, the semiconductor device package 100 may have a symmetric structure with respect to the semiconductor device 130.

Figure 2:
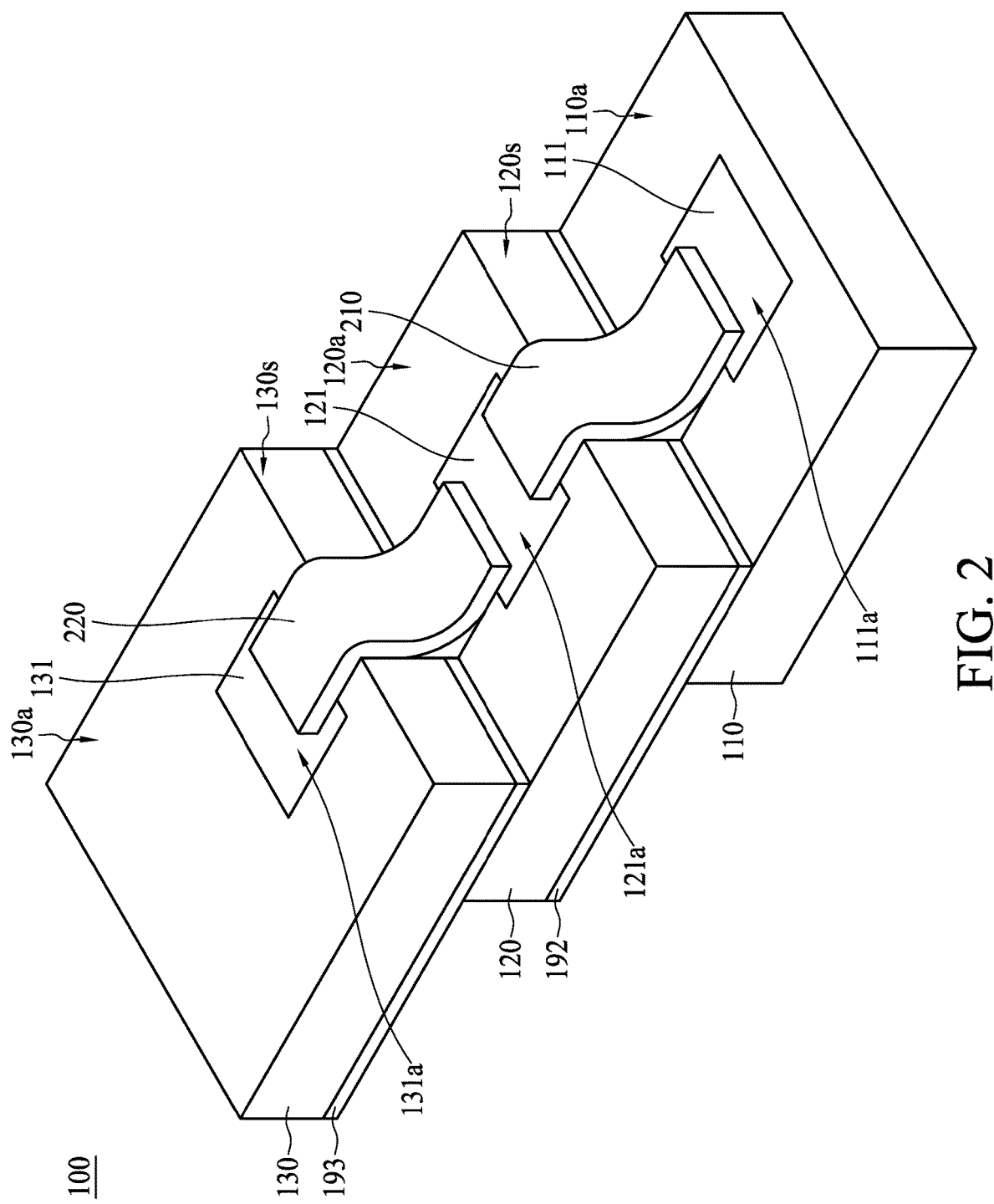
FIG. 2 illustrates a perspective view of a semiconductor device package in accordance with some embodiments of the present disclosure.

FIG. 2 illustrates a perspective view of a portion of the semiconductor device package 100 in accordance with some embodiments of the present disclosure. The figure has been simplified for a better understanding of the aspects of the present disclosure.

As illustrated in FIG. 2, the conductive layer 210 may extend onto and directly contact a portion of the upper surface (e.g., surface 120a) of the semiconductor device 120. The conductive layer 210 may extend onto and directly contact a portion of the lateral surface (e.g., surface 120s) of the semiconductor device 120. The conductive layer 210 may extend onto and directly contact a portion of the upper surface (e.g., surface 110a) of the semiconductor device 110. Two opposite end portions of the conductive layer 210 may extend onto and directly contact the conductive pad 111 of the semiconductor device 110 and the conductive pad 121 of the semiconductor device 120, respectively. In some embodiments, the conductive layer 210 may extend continuously onto and throughout the surface 121a of the conductive pad 121, the surface 120a of the semiconductor device 120, the surface 120s of the semiconductor device 120, the surface 110a of the semiconductor device 110 and the surface 111a of the conductive pad 111 to electrically connect the conductive pad 121 of the semiconductor device 120 to the conductive pad 111 of the semiconductor device 110.

As illustrated in FIG. 2, the conductive layer 220 may extend onto and directly contact a portion of the upper surface (e.g., surface 130a) of the semiconductor device 130. The conductive layer 220 may extend onto and directly contact a portion of the lateral surface (e.g., surface 130s) of the semiconductor device 130. The conductive layer 220 may extend onto and directly contact a portion of the upper surface (e.g., surface 120a) of the semiconductor device 120. Two opposite end portions of the conductive layer 220 may extend onto and directly contact the conductive pad 121 of the semiconductor device 120 and the conductive pad 131 of the semiconductor device 130, respectively. In some embodiments, the conductive layer 220 may extend continuously onto and throughout the surface 131a of the conductive pad 131, the surface 130a of the semiconductor device 130, the surface 130s of the semiconductor device 130, the surface 120a of the semiconductor device 120 and the surface 121a of the conductive pad 121 to electrically connect the conductive pad 131 of the semiconductor device 130 to the conductive pad 121 of the semiconductor device 120. The conductive layer 210 may be spaced apart from the conductive layer 220 above the conductive pad 121.

Figure 3A:
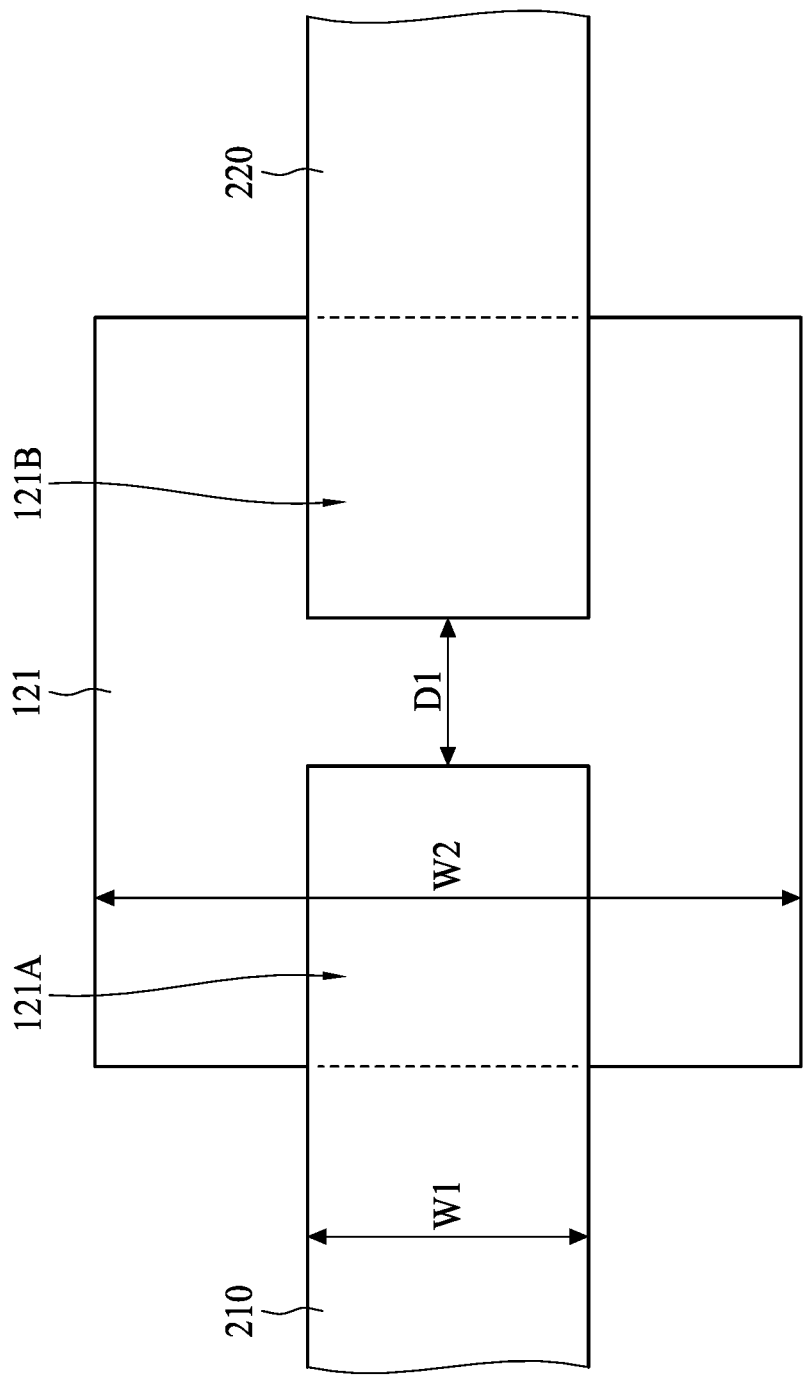
FIG. 3A illustrates an enlarged top view of a portion of a semiconductor device package in accordance with some embodiments of the present disclosure.

FIG. 3A illustrates an enlarged top view of a portion of a semiconductor device package in accordance with some embodiments of the present disclosure. The conductive layer 210 may cover a portion 121A of the conductive pad 121. The portion 121A of the conductive pad 121 may be in direct contact with the conductive layer 210. The conductive layer 220 may cover a portion 121B of the conductive pad 121. The portion 121B of the conductive pad 121 may be in direct contact with the conductive layer 220. The portion 121A of the conductive pad 121 may be opposite to the portion 121B of the conductive pad 121. The portion 121A of the conductive pad 121 may be spaced apart from the portion 121B of the conductive pad 121. In some embodiments, a width W2 of the conductive pad 121 may be substantially greater than a width W1 of the conductive layer 210.

Figure 3B:
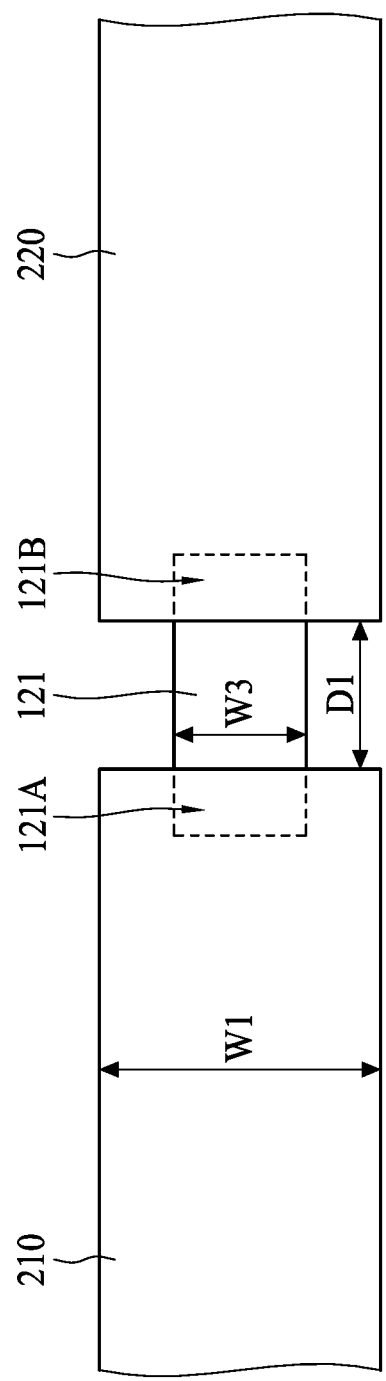
FIG. 3B illustrates an enlarged top view of a portion of a semiconductor device package in accordance with some embodiments of the present disclosure.

FIG. 3B illustrates an enlarged top view of a portion of a semiconductor device package in accordance with some embodiments of the present disclosure. The structure in FIG. 3B is similar to the structure in FIG. 3A except that, in some embodiments, a width W3 of the conductive pad 121 may be less than a width W1 of the conductive layer 210.

FIG. 3C illustrates an enlarged top view of a portion of a semiconductor device package in accordance with some embodiments of the present disclosure. The structure in FIG. 3C is similar to the structure in FIG. 3A except that, in some embodiments, a width W4 of the conductive pad 121 may be substantially equal to a width W1 of the conductive layer 210.

Figure 4A:
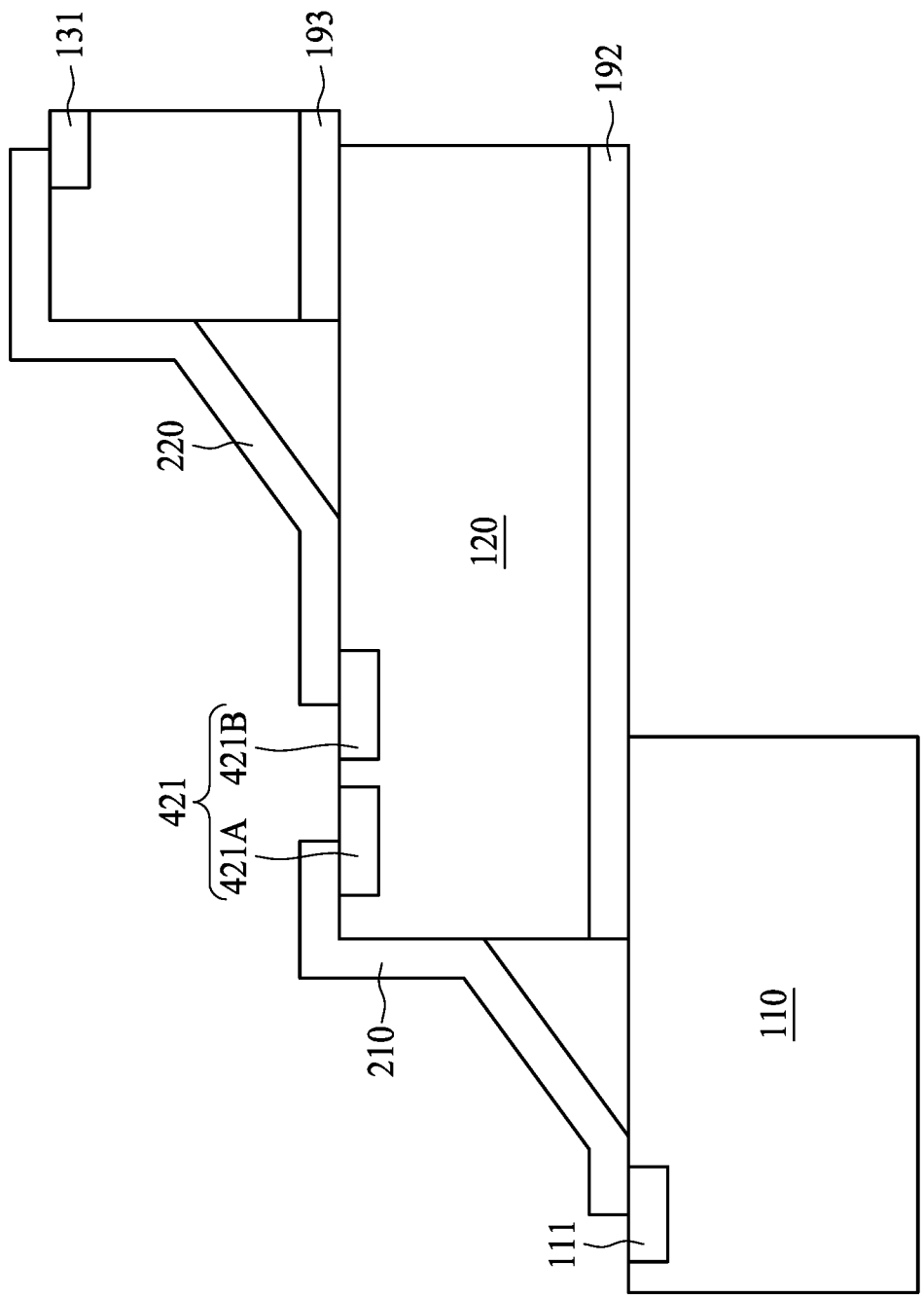
FIG. 4A illustrates an enlarged cross-sectional view of a portion of a semiconductor device package in accordance with some embodiments of the present disclosure.

FIG. 4A illustrates an enlarged cross-sectional view of a portion of a semiconductor device package in accordance with some embodiments of the present disclosure. The structure in FIG. 4A is similar to the structure of the corresponding portion in FIG. 1 except that, in some embodiments, the conductive pad 421 of the semiconductor device 120 may include a pad 421A and a pad 421B spaced apart from each other. The conductive layer 210 and the conductive layer 220 may be disposed in direct contact with the pad 421A and the pad 421B, respectively. The pad 421A may be electrically connected to the pad 421B through an internal interconnection structure (not shown) within the semiconductor device 120.

Figure 4B:
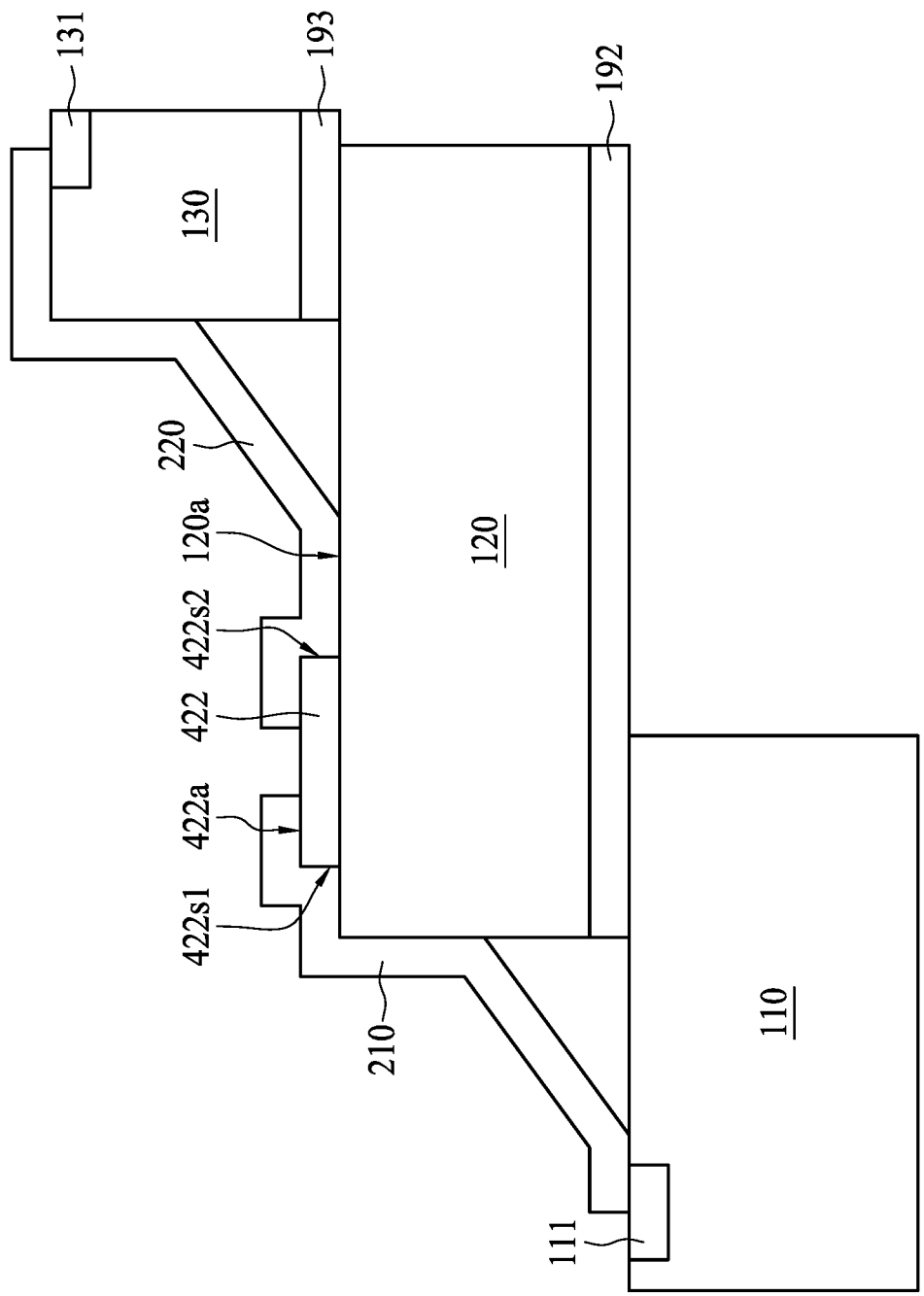
FIG. 4B illustrates an enlarged cross-sectional view of a portion of a semiconductor device package in accordance with some embodiments of the present disclosure.

FIG. 4B illustrates an enlarged cross-sectional view of a portion of a semiconductor device package in accordance with some embodiments of the present disclosure. The structure in FIG. 4B is similar to the structure of the corresponding portion in FIG. 1 except that, in some embodiments, the conductive pad 422 of the semiconductor device 120 may protrude from the surface 120a of the semiconductor device 120. The conductive pad 422 may have a surface 422a (which may also be referred as "an upper surface") and a surface 422s1 (which may also be referred to as "a lateral surface") substantially perpendicular to the surface 422a. The conductive layer 210 may be in direct contact with the surface 422a and the surface 422s1 of the conductive pad 422 of the semiconductor device 120. The conductive pad 422 may have a surface 422s2 opposite to the surface 422s1. The conductive layer 220 may be in direct contact with the surface 422a and the surface 422s2 of the conductive pad 422.

Figure 4C:
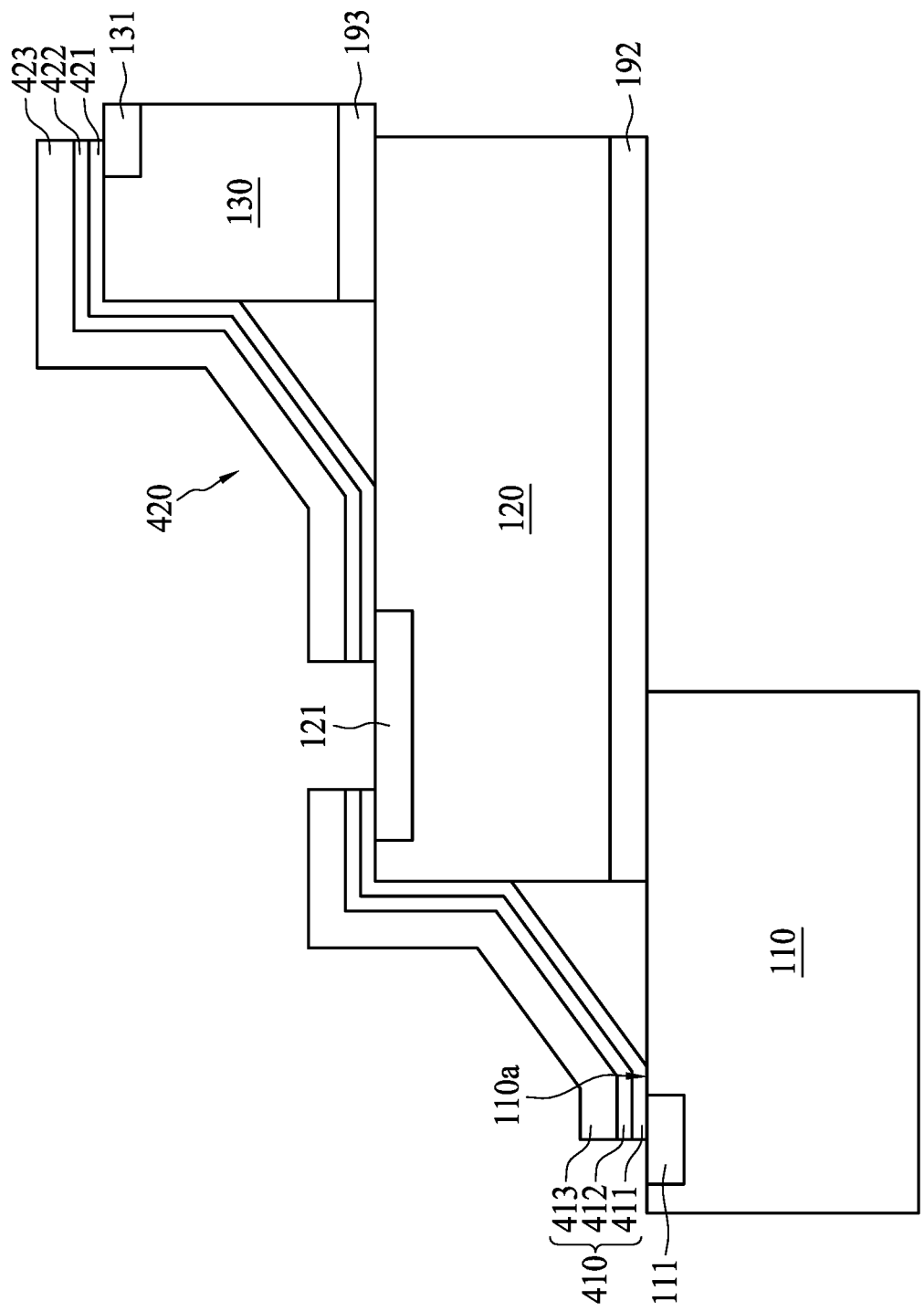
FIG. 4C illustrates an enlarged cross-sectional view of a portion of a semiconductor device package in accordance with some embodiments of the present disclosure.

FIG. 4C illustrates an enlarged cross-sectional view of a portion of a semiconductor device package in accordance with some embodiments of the present disclosure. The structure in FIG. 4C is similar to the structure of the corresponding portion in FIG. 1 except that, in some embodiments, the conductive layer 410 may include sub-layers 411, 412 and 413.

The sub-layer 411 may be disposed in direct contact with the conductive pad 121. The sub-layer 412 may be disposed in direct contact with the sub-layer 411. The sub-layer 413 may be disposed in direct contact with the sub-layer 412. In some embodiments, the sub-layer 411 and the sub-layer 412 may be seed layers, and the sub-layer 413 may be a conductive layer. The seed layer 411 may be disposed in direct contact with the surface 110a of the semiconductor device 110. The seed layer 411 may be disposed in direct contact with the conductive pad 111 of the semiconductor device 110. The seed layer 411 may be disposed in direct contact with the conductive pad 121 of the semiconductor device 120. The conductive layer 420 may include sub-layers 421, 422 and 423. In some embodiments, the sub-layer 421 and the sub-layer 422 may be seed layers, and the sub-layer 423 may be a conductive layer. The seed layer 421 may be disposed in direct contact with the conductive pad 121 of the semiconductor device 120 and the conductive pad 131 of the semiconductor device 130. In some embodiments, the seed layer 421 may be formed of or include titanium (Ti), and the seed layer 412 may be formed of or include copper (Cu).

Figure 5:
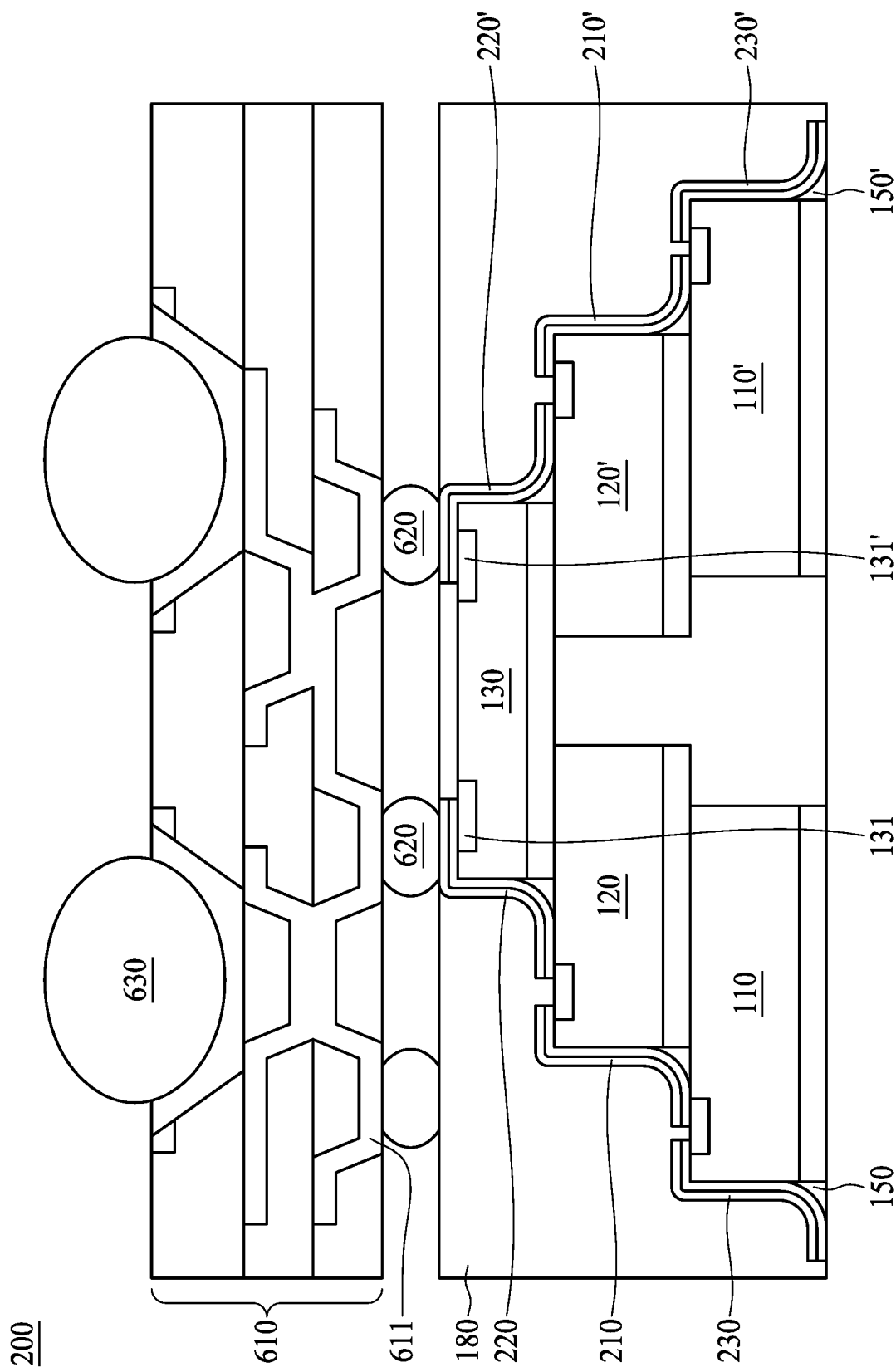
FIG. 5 illustrates a cross-sectional view of a semiconductor device package in accordance with some embodiments of the present disclosure.

FIG. 5 illustrates a cross-sectional view of a semiconductor device package 200 in accordance with some embodiments of the present disclosure. The semiconductor device package 200 may include semiconductor devices 110, 110', 120, 120' and 130, conductive layers 210, 210', 220 and 220', supporting structures 150, 150', 160, 160', 170 and 170', an encapsulation layer 180, an interconnection structure 610, an electrical contact 620 and an external connector 630.

The interconnection structure 610 may be disposed on the semiconductor devices 110, 110', 120, 120' and 130. The interconnection structure 610 may include redistribution layers (RDL). The interconnection structure 610 may include conductive units (such as pads, wires, and/or vias) and a dielectric layer. A portion of the conductive units may be covered or encapsulated by the dielectric layer while another portion 611 of the conductive units may be exposed from the dielectric layer to provide electrical connections for the semiconductor devices 110, 110', 120, 120' and 130.

The electrical contact 620 (e.g., a solder ball) may be disposed between the interconnection structure 610 and the semiconductor devices 110, 110', 120, 120' and 130. The electrical contact 620 may directly contact the exposed portion 611 of the conductive units of the interconnection structure 610. The electrical contact 620 may directly contact the conductive layer 220. The electrical contact 620 may directly contact the conductive layer 220'. In some embodiments, the electrical contact 620 may include a conductive bump.

The external connector 630 (e.g. a solder ball) may be disposed on a surface of the interconnection structure 610 facing away from the semiconductor devices 110, 110', 120, 120' and 130. The external connector 630 can provide electrical connections between the semiconductor package devices 110, 110', 120, 120' and 130 and external components (e.g. external circuits or circuit boards). In some embodiments, the external connector 630 may include a controlled collapse chip connection (C4) bump, a ball grid array (BGA) and/or a land grid array (LGA).

FIGS. 6A, 6B, 6C, 6D, 6E, 6F, 6G, 6H, 6I, 6J, 6K and 6L illustrate a method of manufacturing a semiconductor device package 100 in accordance with some embodiments of the present disclosure. Various figures have been simplified for a better understanding of the aspects of the present disclosure.

Figure 6A:
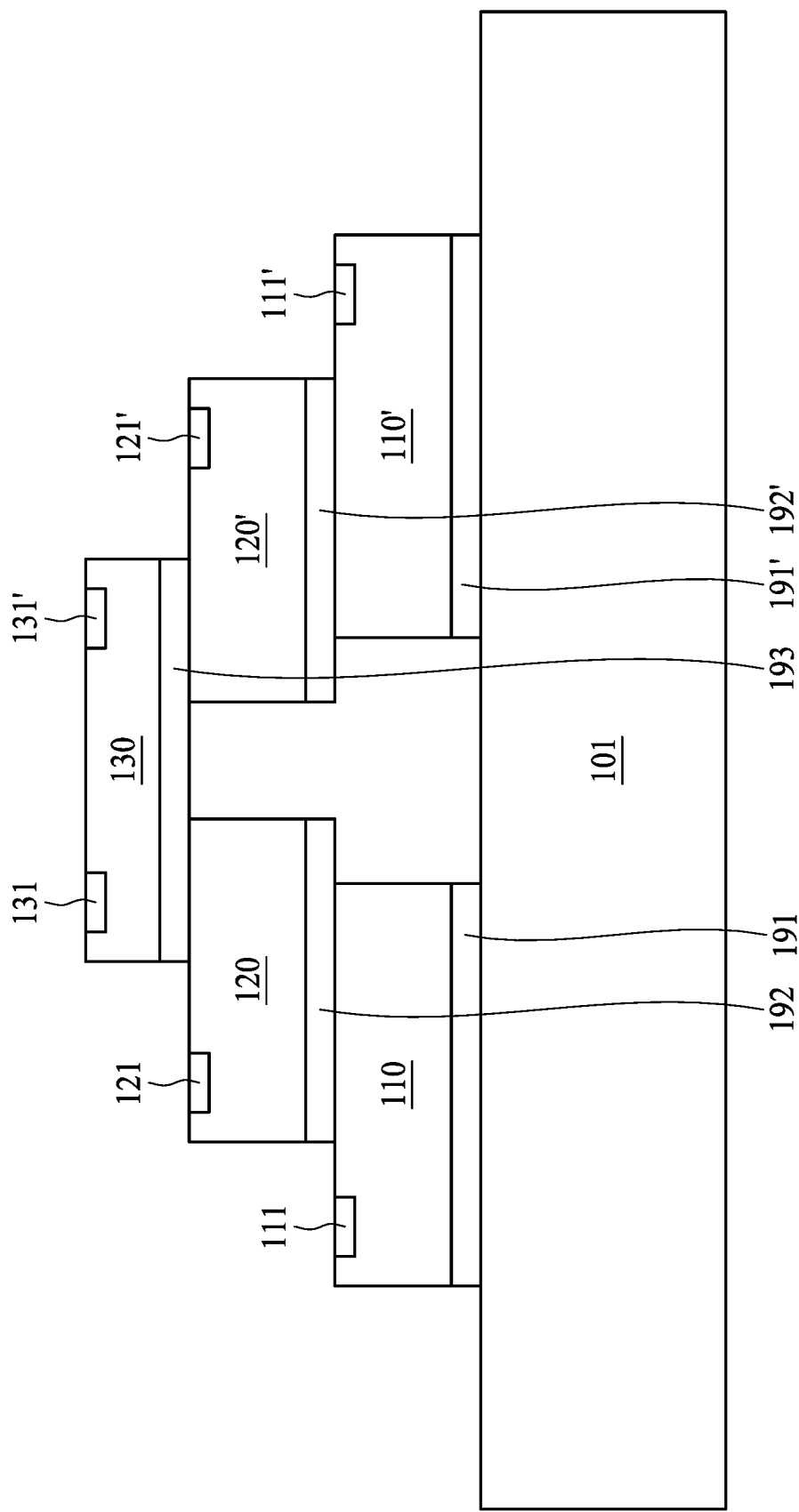
FIG. 6A, FIG. 6B, FIG. 6C, FIG. 6D, FIG. 6E, FIG. 6F, FIG. 6G, FIG. 6H, FIG. 6I, FIG. 6J, FIG. 6K and FIG. 6L illustrate a method of manufacturing a semiconductor device package in accordance with some embodiments of the present disclosure.

Referring to FIG. 6A, a carrier 101 may be provided. A semiconductor device 110 having a conductive pad 111 may be disposed on the carrier 101. A semiconductor device 110' having a conductive pad 111' may be disposed on the carrier 101. The semiconductor devices 110 and 110' may be attached to the carrier 101 through an adhesive layer 191 and an adhesive layer 191', respectively. A semiconductor device 120 having a conductive pad 121 may be stacked on the semiconductor device 110. A semiconductor device 120' having a conductive pad 121' may be stacked on the semiconductor device 110'. The semiconductor devices 120 may be attached to the semiconductor device 110 through an adhesive layer 192. The semiconductor devices 120' may be attached to the semiconductor device 110' through an adhesive layer 192'. A semiconductor device 130 having conductive pads 131 and 131' may be stacked on the semiconductor devices 120 and 120'. In some embodiments, the adhesive layer 191, 191', 192, 192' and/or 193 may include a die attach film (DAF).

Figure 6B:
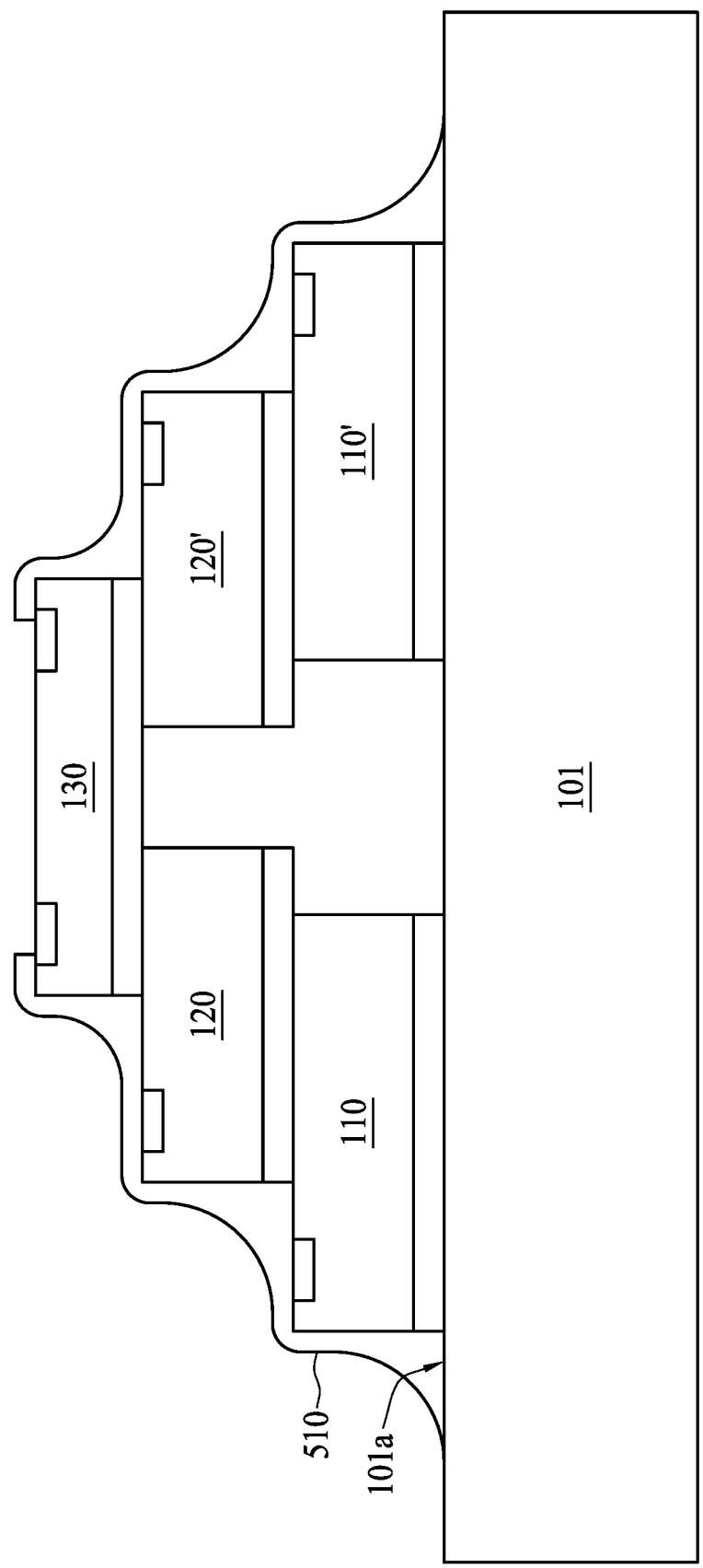

Referring to FIG. 6B, an insulation material 510 may be formed on the semiconductor devices 110, 110', 120, 120' and 130. The insulation material 510 may cover the semiconductor devices 110, 110', 120, 120' and 130 and at least a portion of a surface 101a (which may also be referred to as "an upper surface") of the carrier 101. In some embodiments, the insulation material 510 may include PI, epoxy resin, or a combination thereof. In some embodiments, the insulation material 510 may be formed by a coating process, such as a spin coating process.

Figure 6C:
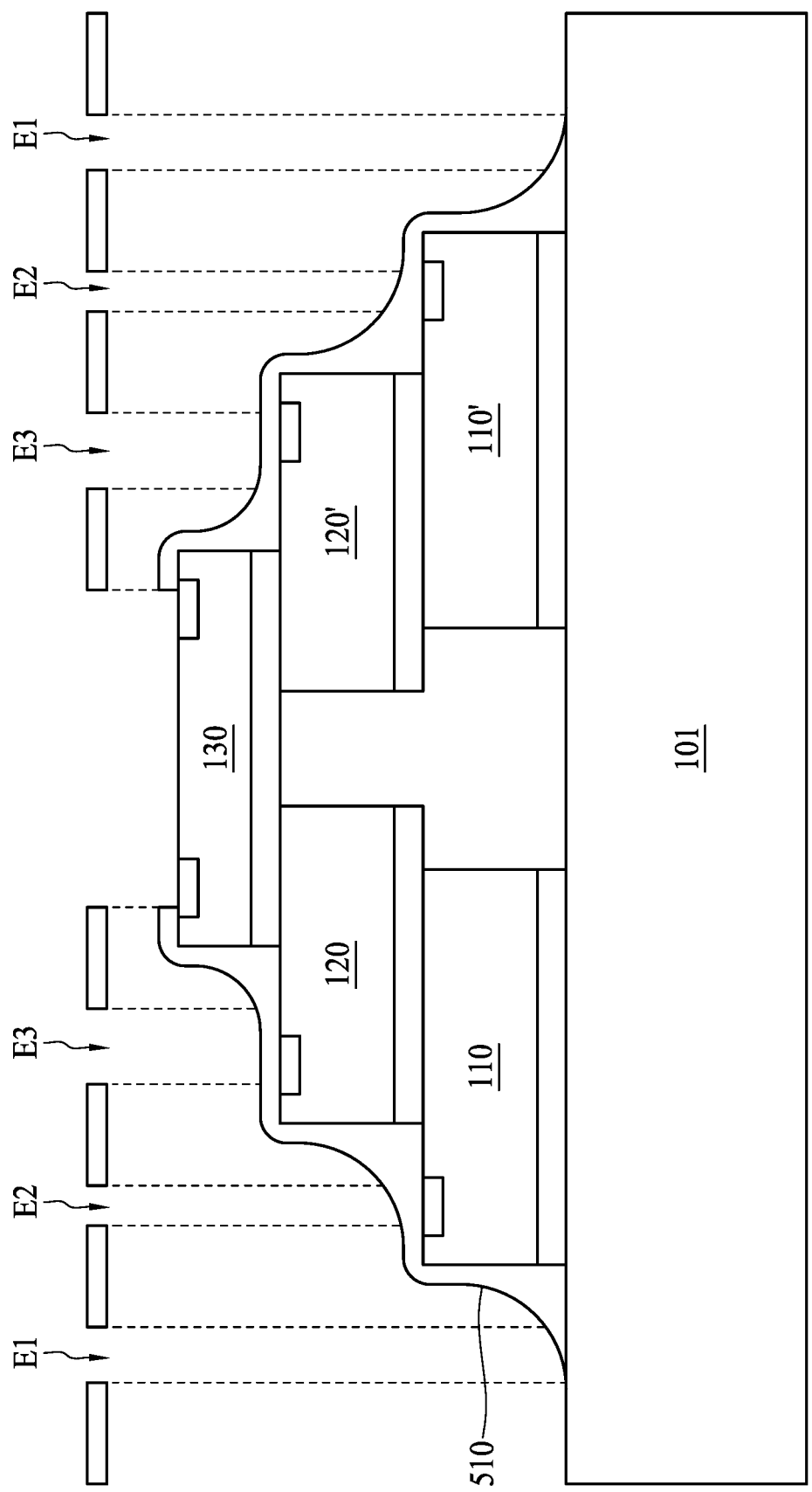

Referring to FIG. 6C, the insulation material 510 may be partially removed. A plurality of exposure processes E1, E2 and E3 may be performed on a plurality of portions of the insulation material 510. In some embodiments, each of the exposure processes E1, E2 and E3 may use a respective alignment mask. Each respective alignment mask may correspond to each of the edge portions (e.g., edge portions 110E, 120E and 130E in FIG. 7D) of the semiconductor devices 110, 110', 120, 120' and 130.

Figure 6D:
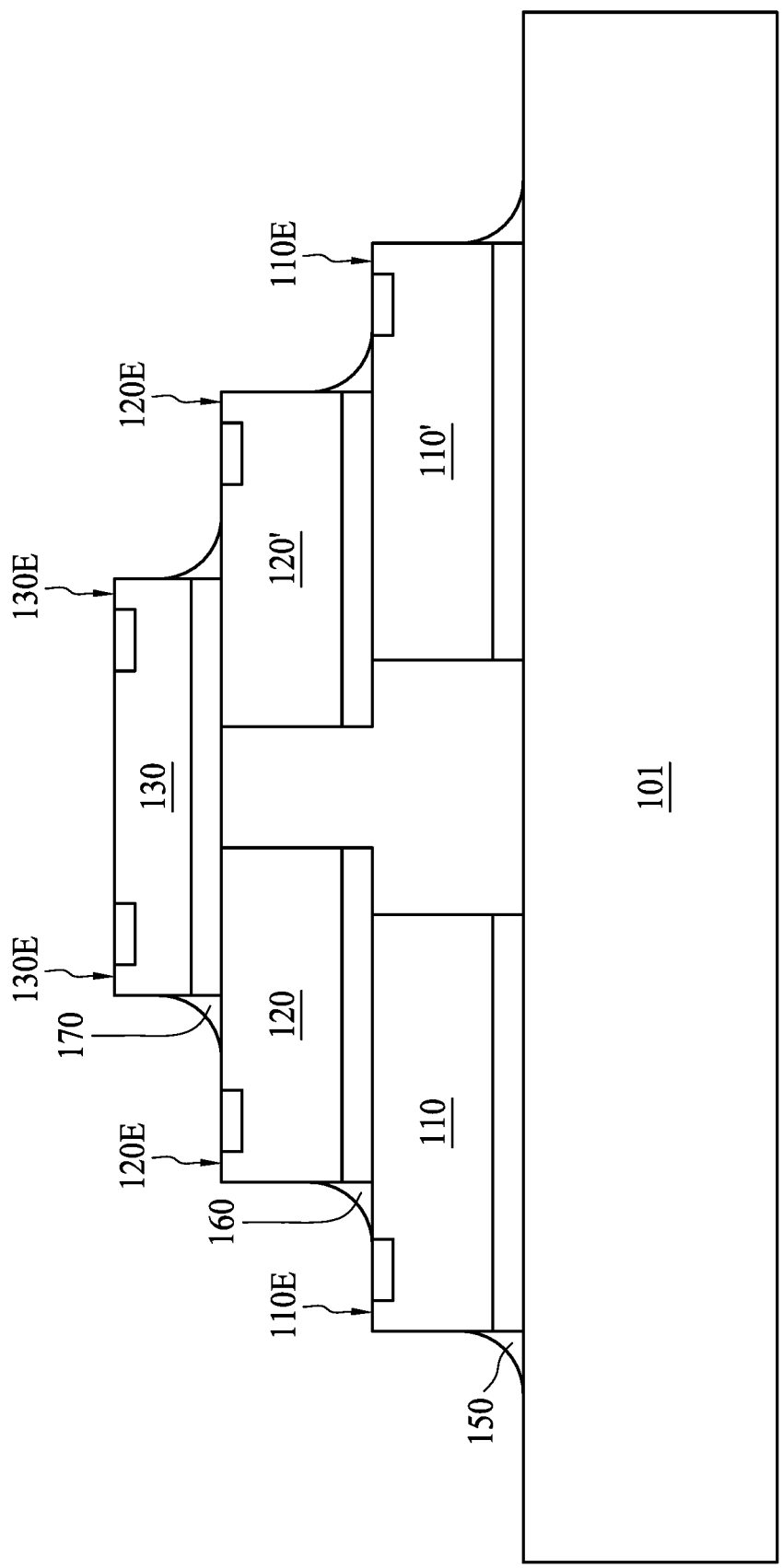

Referring to FIG. 6D, after the exposure processes E1, E2 and E3 are performed on the portions of the insulation material 510, a development process may then be performed to remove the exposed portions of the insulation material 510. The remained unexposed portions of the insulation material 510 may form supporting structures 150, 160 and 170. Partially removing the insulation material 510 may expose a plurality of edge portions 110E, 120E and 130E of the semiconductor devices 110, 110', 120, 120' and 130. The edge portions 110E of the semiconductor devices 110 and 110' may be defined by the exposure process E1. The edge portions 120E of the semiconductor devices 120 and 120' may be defined by the exposure process E2. The edge portions 130E of the semiconductor device 130 may be defined by the exposure process E3.

Figure 6E:
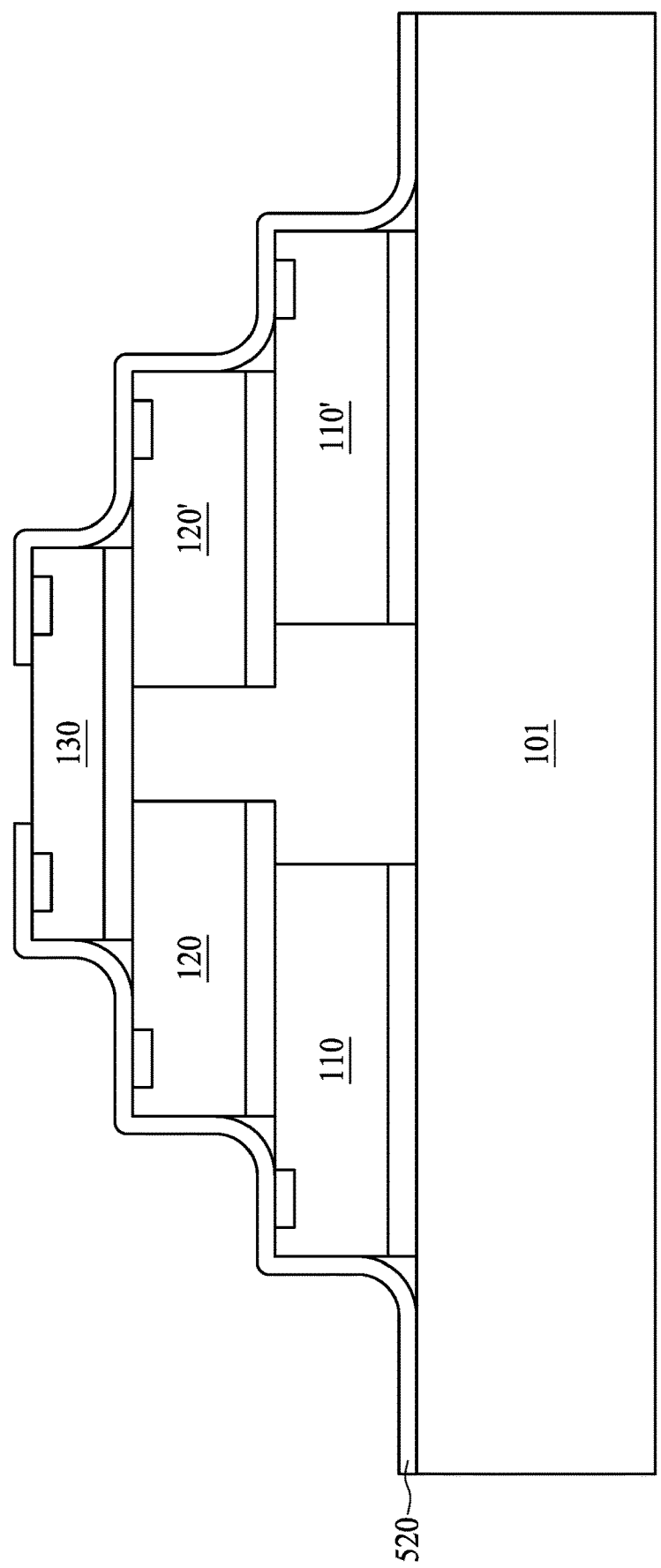

Referring to FIG. 6E, a seed layer 520 may be formed on the supporting structures 150, 160 and 170 and the semiconductor devices 110, 110', 120, 120' and 130. In some embodiments, the seed layer 520 may include multiple layers, for example, a titanium (Ti) layer and a copper (Cu) layer formed on the titanium (Ti) layer. In some embodiments, the seed layer 520 may be formed by sputtering.

Figure 6F:
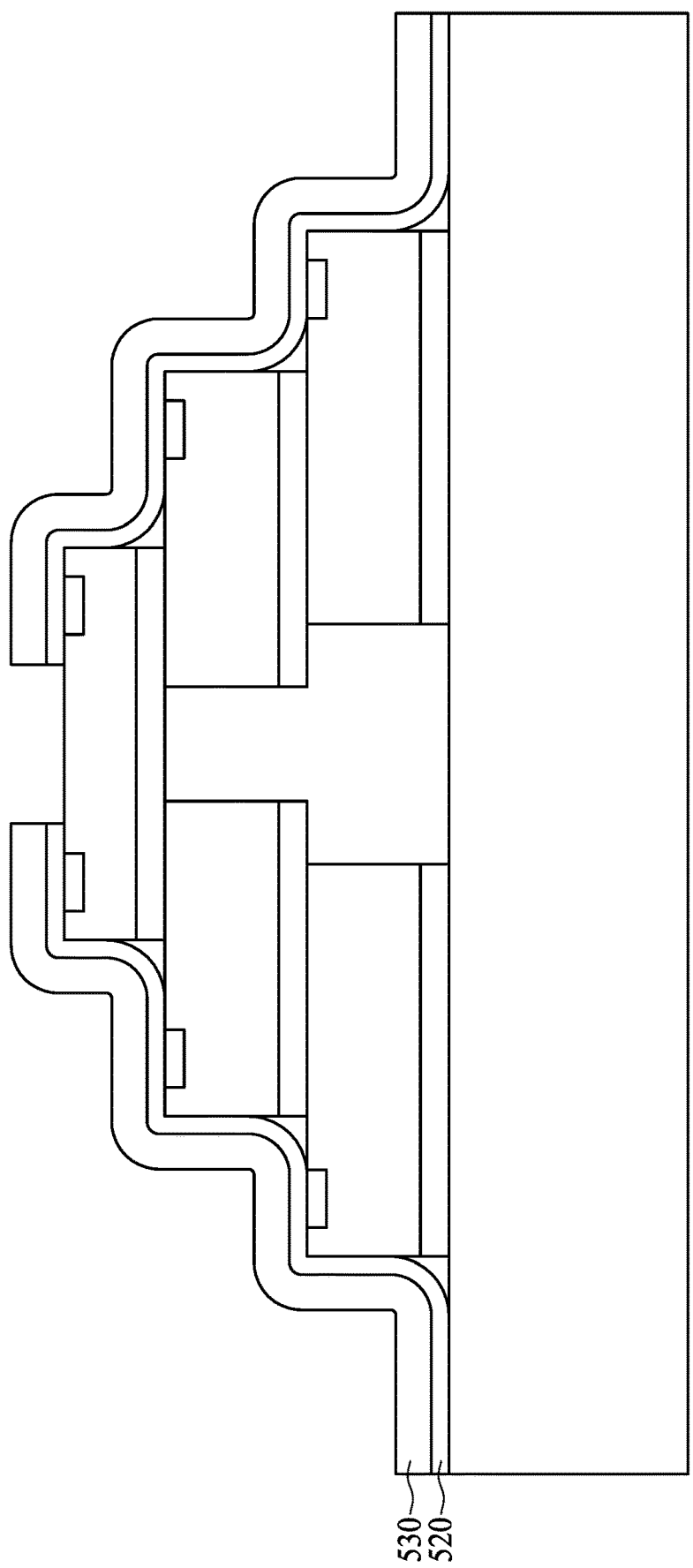

Referring to FIG. 6F, a photoresist material 530 may be formed on the seed layer 520.

Figure 6G:
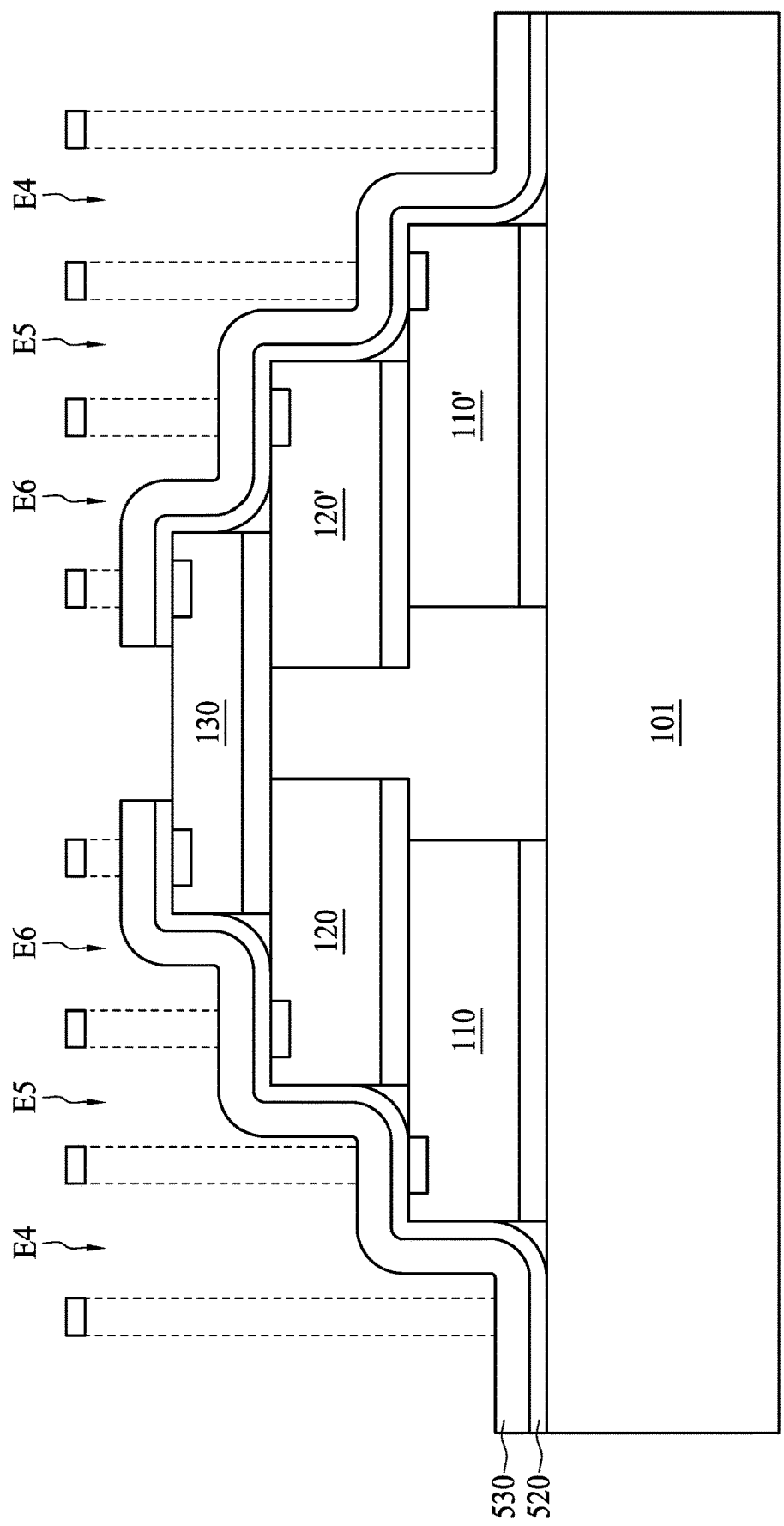

Referring to FIG. 6G, the photoresist material 530 may be partially removed. A plurality of exposure processes E4, E5 and E6 may be performed on a plurality of portions of the photoresist material 530. In some embodiments, each of the exposure processes E4, E5 and E6 may use a respective alignment mask. Each respective alignment mask may correspond to the location of each of the conductive layers to be formed subsequently (e.g., conductive layers 210, 220 and 230).

Figure 6H:
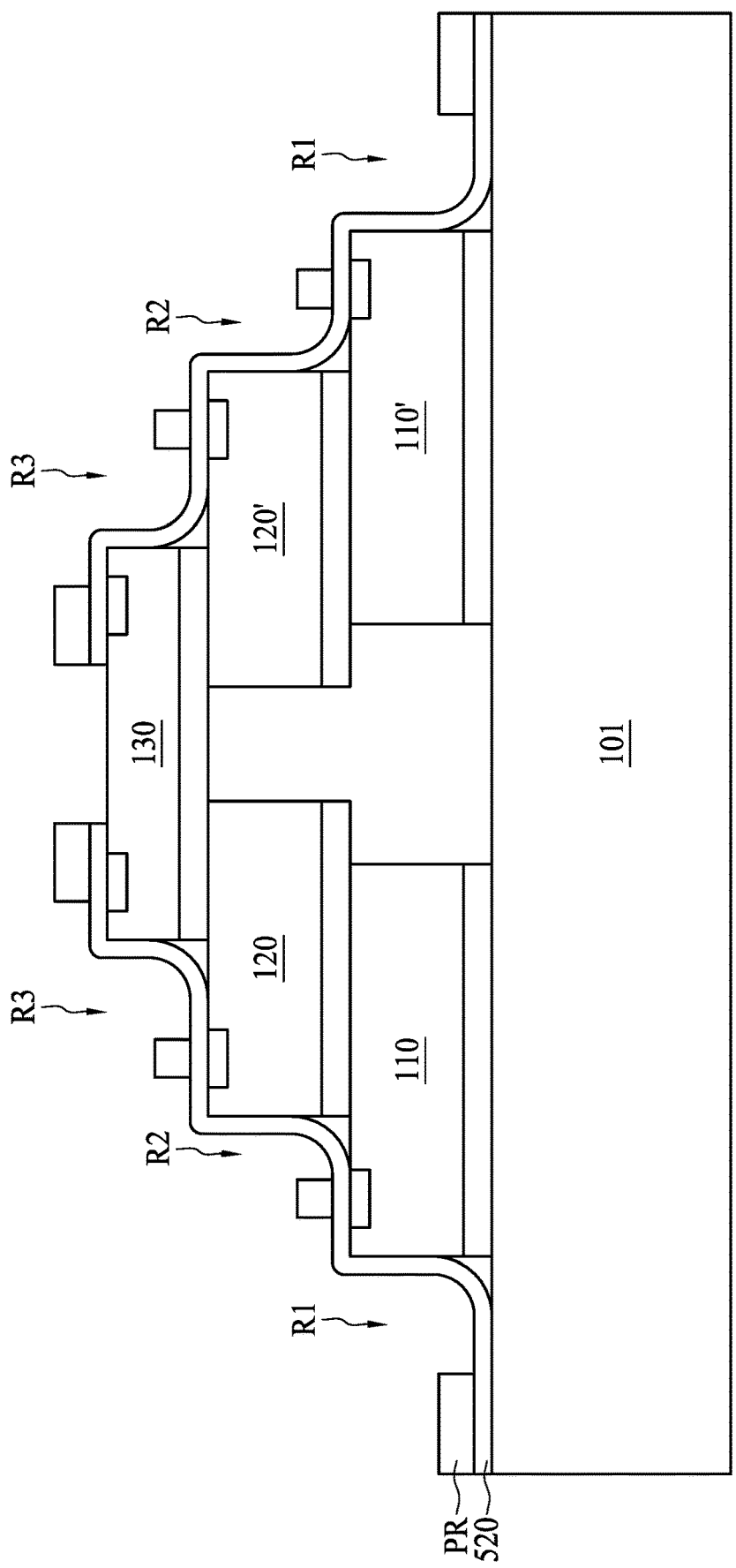

Referring to FIG. 6H, after the exposure processes E4, E5 and E6 are performed on the portions of the photoresist material 530, a development process may then be performed to remove the exposed portions of the photoresist material 530 to form a patterned photoresist layer PR. The patterned photoresist layer PR has a plurality of openings to expose a plurality of predetermined regions R1, R2 and R3. Portions of the seed layer 520 at the predetermined regions R1, R2 and R3 may be exposed from the patterned photoresist layer PR.

Figure 6I:
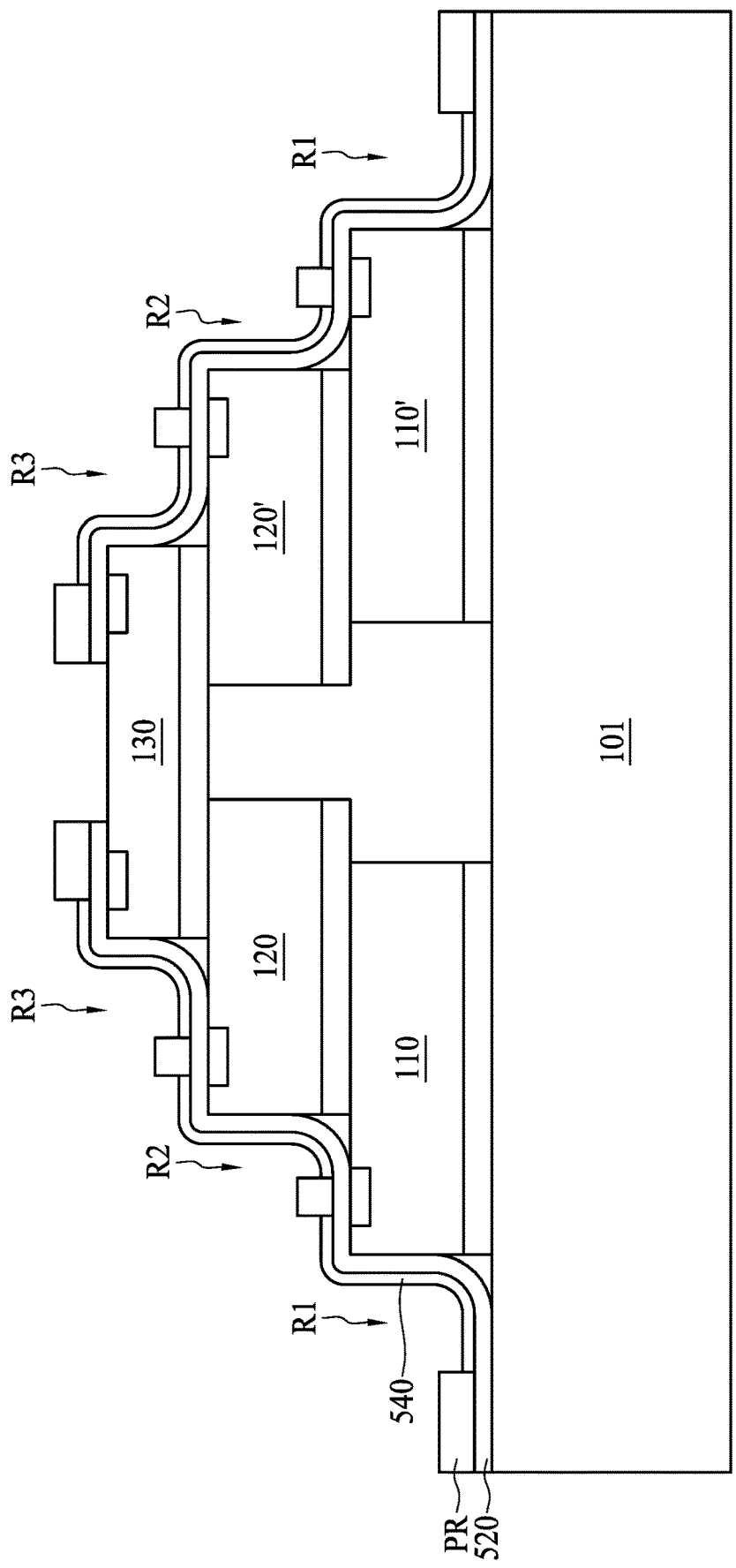

Referring to FIG. 6I, a conductive material layer 540 may be formed on the plurality of predetermined regions R1, R2 and R3. The conductive material layer 540 may be formed directly contacting the seed layer 520. In some embodiments, the conductive material layer 540 may be formed by an electroplating process.

Figure 6J:
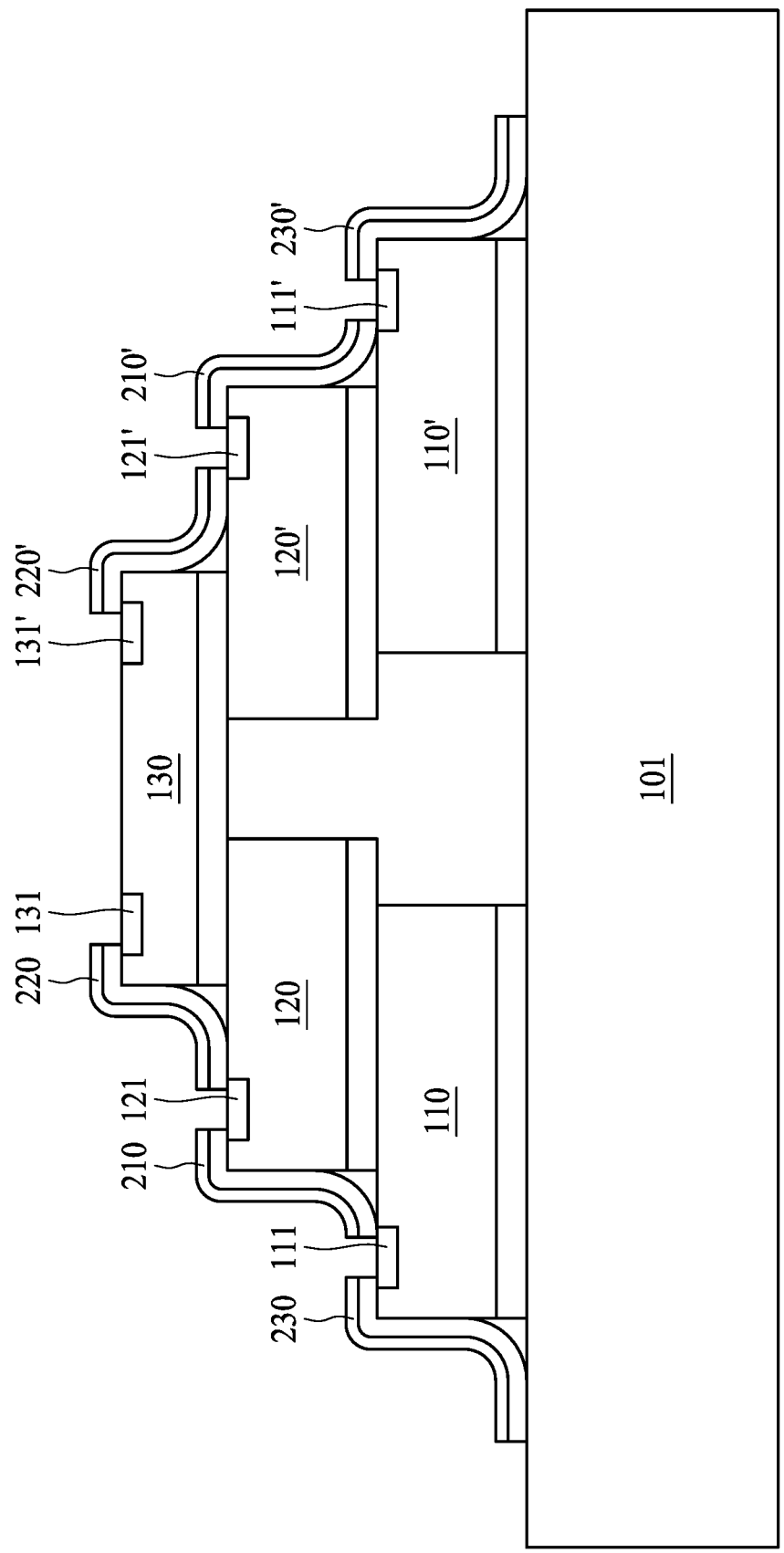

Referring to FIG. 6J, after the conductive material layer 540 is formed on the plurality of predetermined regions R1, R2 and R3, the patterned photoresist layer PR may be removed. After the conductive material layer 540 is formed on the plurality of predetermined regions R1, R2 and R3, portions of the seed layer 520 under the patterned photoresist layer PR may be removed. In some embodiments, the patterned photoresist layer PR may be removed by a stripping process. In some embodiments, the portions of the seed layer 520 may be removed by a wet etching process. After the patterned photoresist layer PR and the portions of the seed layer 520 under the patterned photoresist layer PR are removed, conductive layers 210, 220 and 230 are formed in the predetermined regions R2, R3 and R1, respectively. The conductive layers 210, 220 and 230 may include portions of the conductive material layer 540 and portions of the seed layer 520.

Figure 6K:
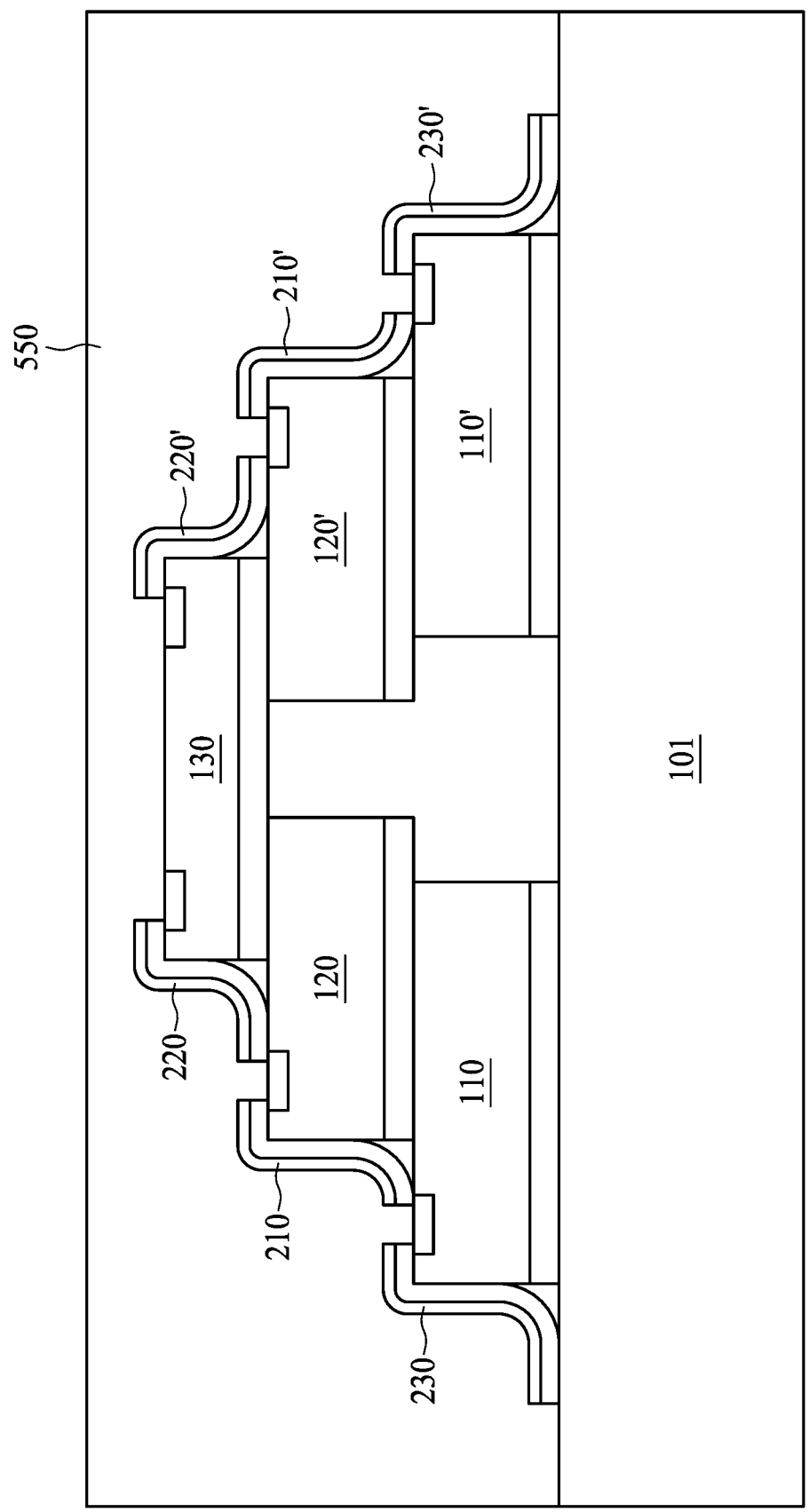

Referring to FIG. 6K, an encapsulation material 550 may be formed on the semiconductor devices 110, 110', 120, 120' and 130. The encapsulation material 550 may be formed on the conductive layers 210, 210', 220, 220', 230 and 230. The encapsulation material 550 may cover the conductive layers 210, 210', 220, 220', 230 and 230.

Figure 6L:
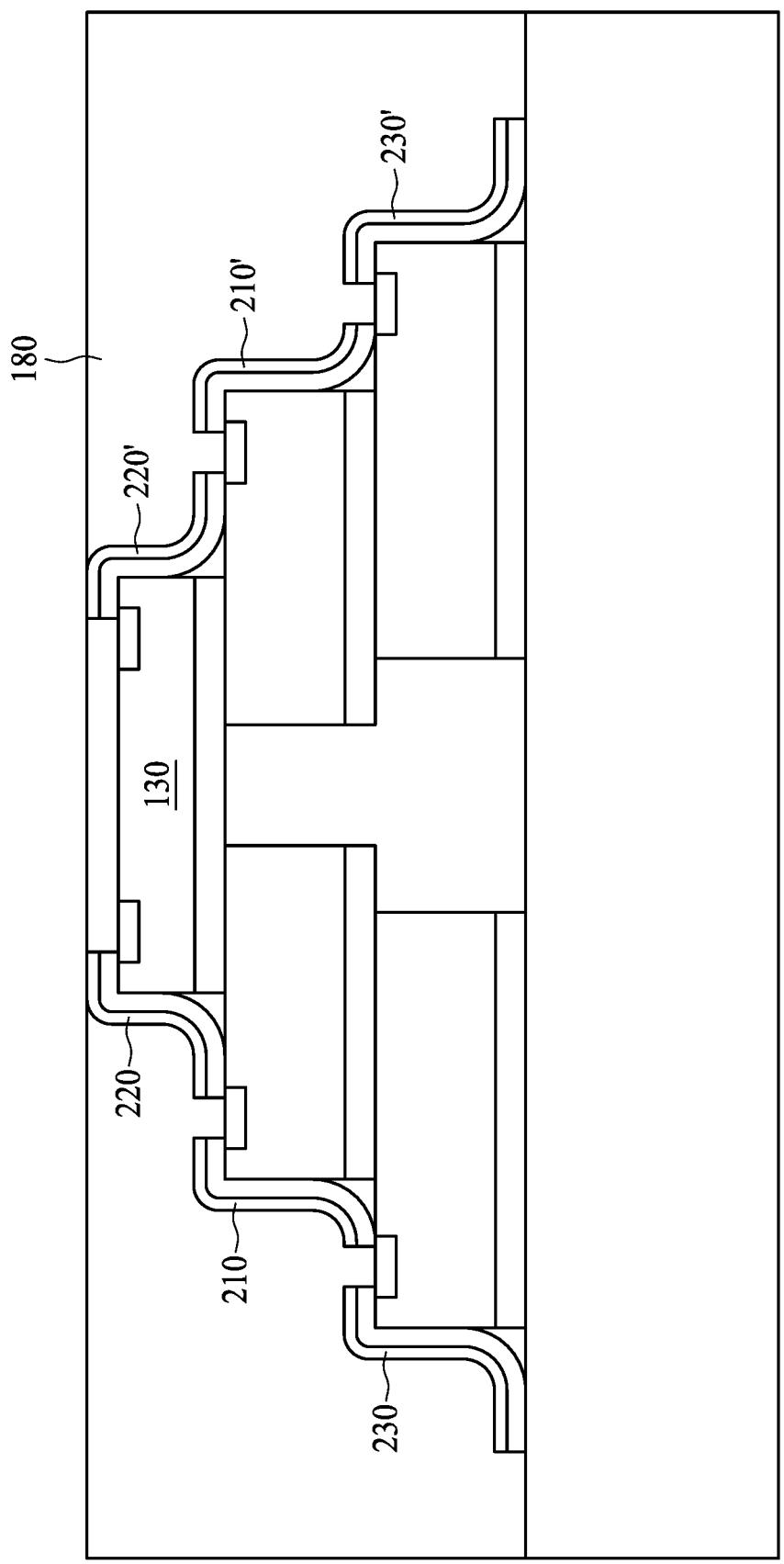

Referring to FIG. 6L, the encapsulation material 550 may be partially removed to form an encapsulation layer 180. The encapsulation material 550 may be partially removed to expose a portion of the conductive layer 220. The encapsulation material 550 may be partially removed to expose a portion of the conductive layer 220'. In some embodiments, the encapsulation material 550 may be partially removed by a grinding process.

FIG. 7A, FIG. 7B, FIG. 7C, FIG. 7D and FIG. 7E illustrate a method of manufacturing a semiconductor device package 200 in accordance with some embodiments of the present disclosure. Various figures have been simplified for a better understanding of the aspects of the present disclosure.

Figure 7A:
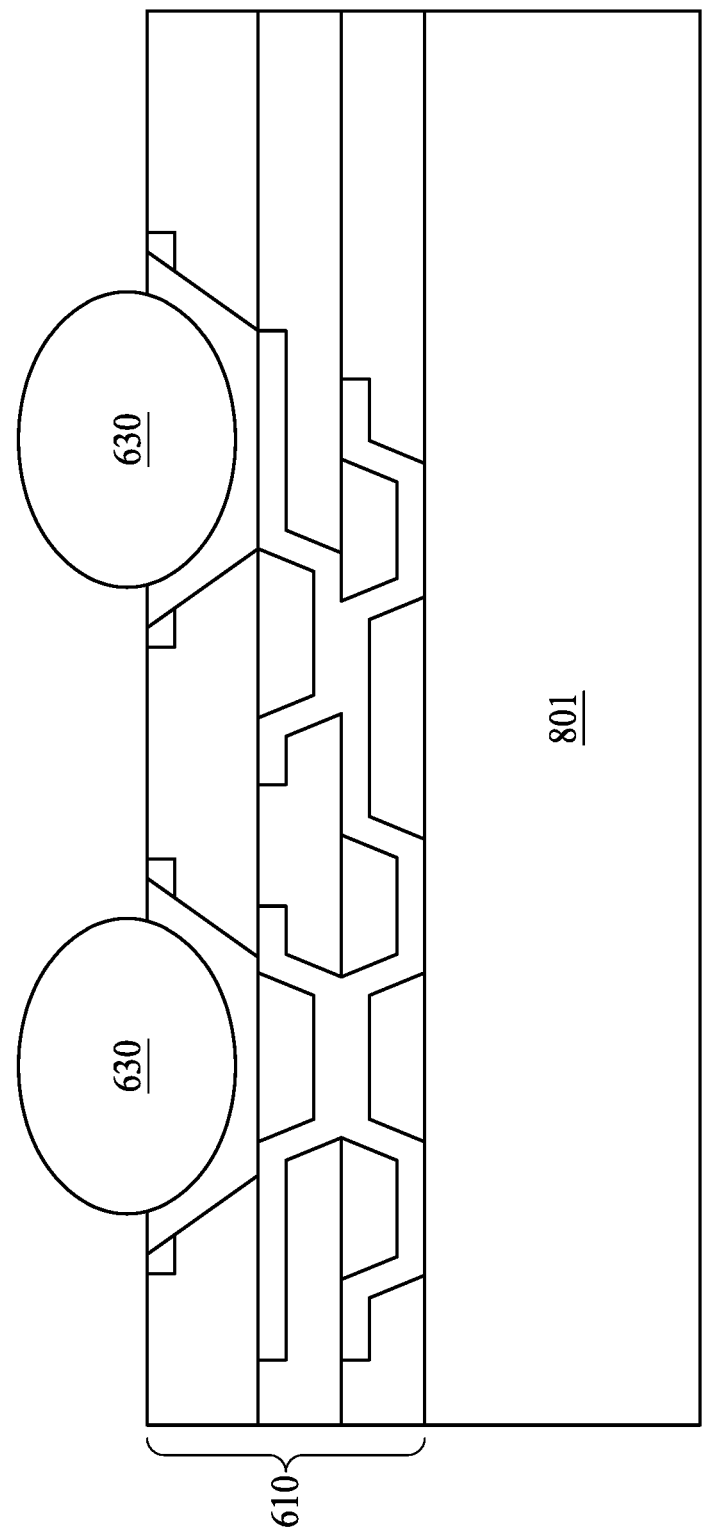
FIG. 7A, FIG. 7B, FIG. 7C, FIG. 7D and FIG. 7E illustrate a method of manufacturing a semiconductor device package in accordance with some embodiments of the present disclosure.

Referring to FIG. 7A, an interconnection structure 610 with external connectors 630 formed thereon may be provided. The interconnection structure 610 may be formed on a carrier 801. The external connectors 630 may be formed on the interconnection structure 610.

Figure 7B:
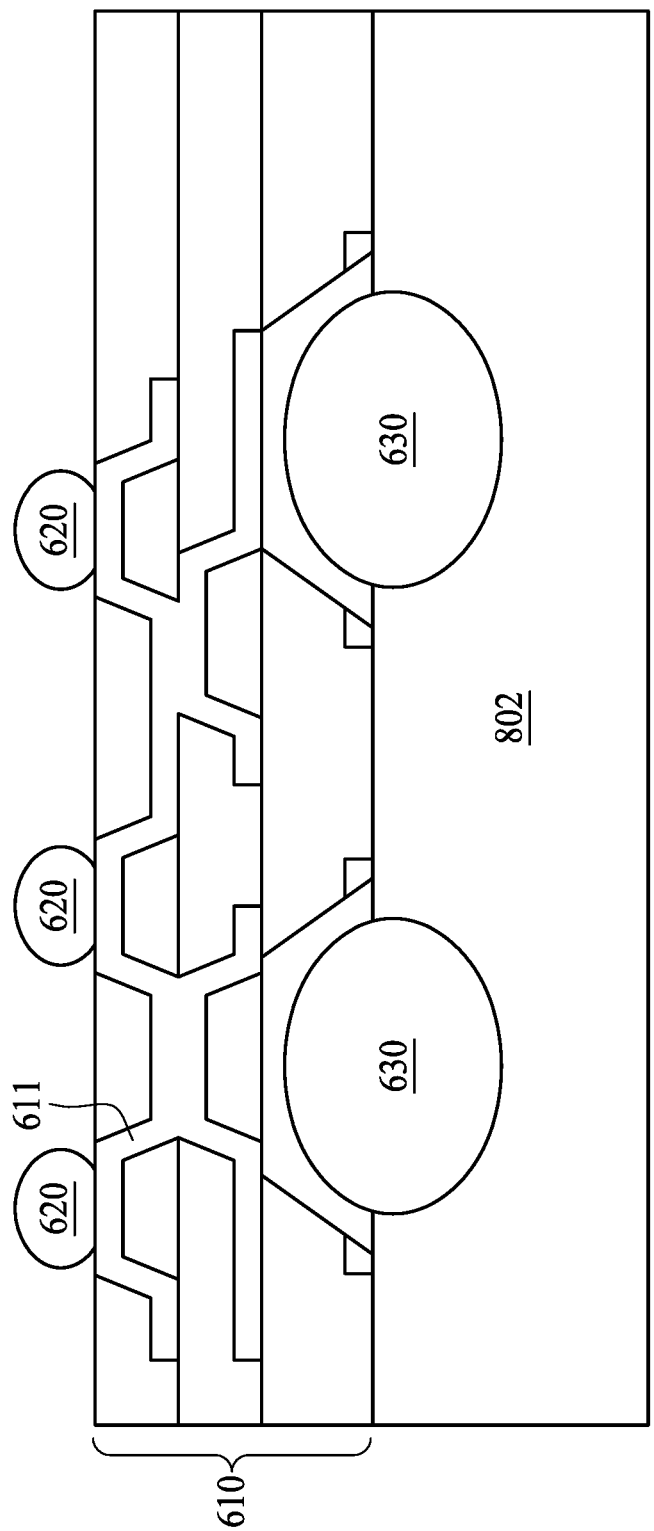

Referring to FIG. 7B, a carrier 802 may be attached to the interconnection structure 610 and the external connectors 630. The carrier 802 may be bonded to a surface of the interconnection structure 610 where the external connectors 630 are located. The carrier 801 may then be removed to expose a portion 611 of the conductive units and/or redistribution layers of the interconnection structure 610. One or more electrical contacts 620 may then be formed directly contacting the exposed portion 611.

Figure 7C:
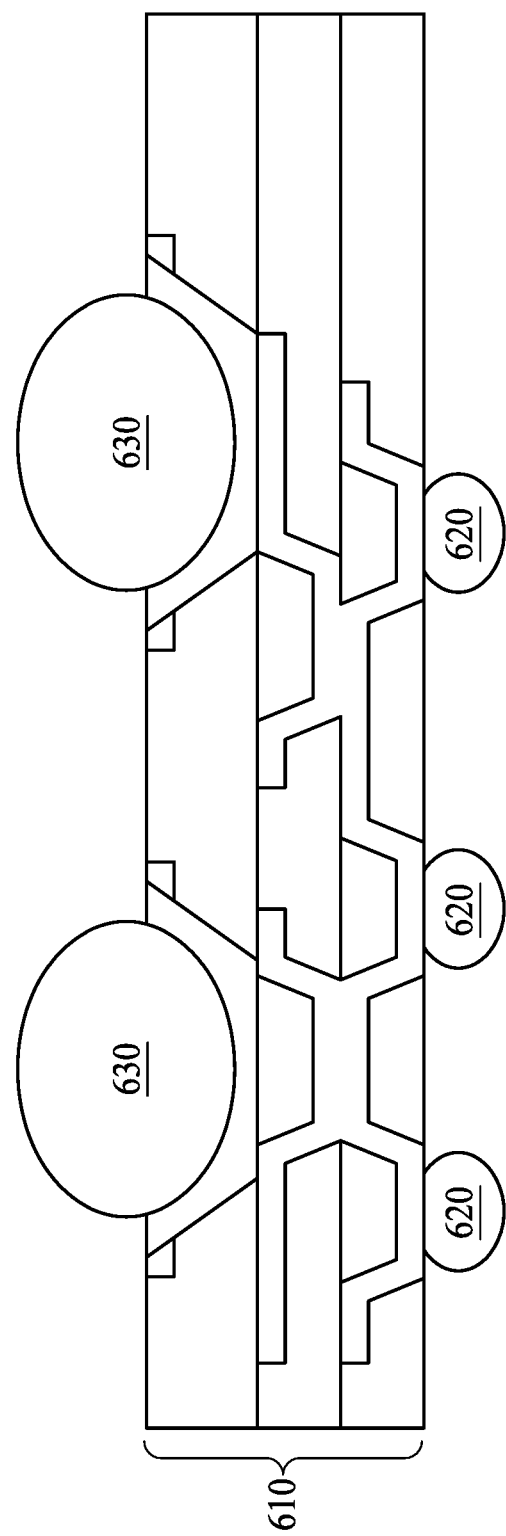

Referring to FIG. 7C, the carrier 802 may be removed.

Figure 7D:
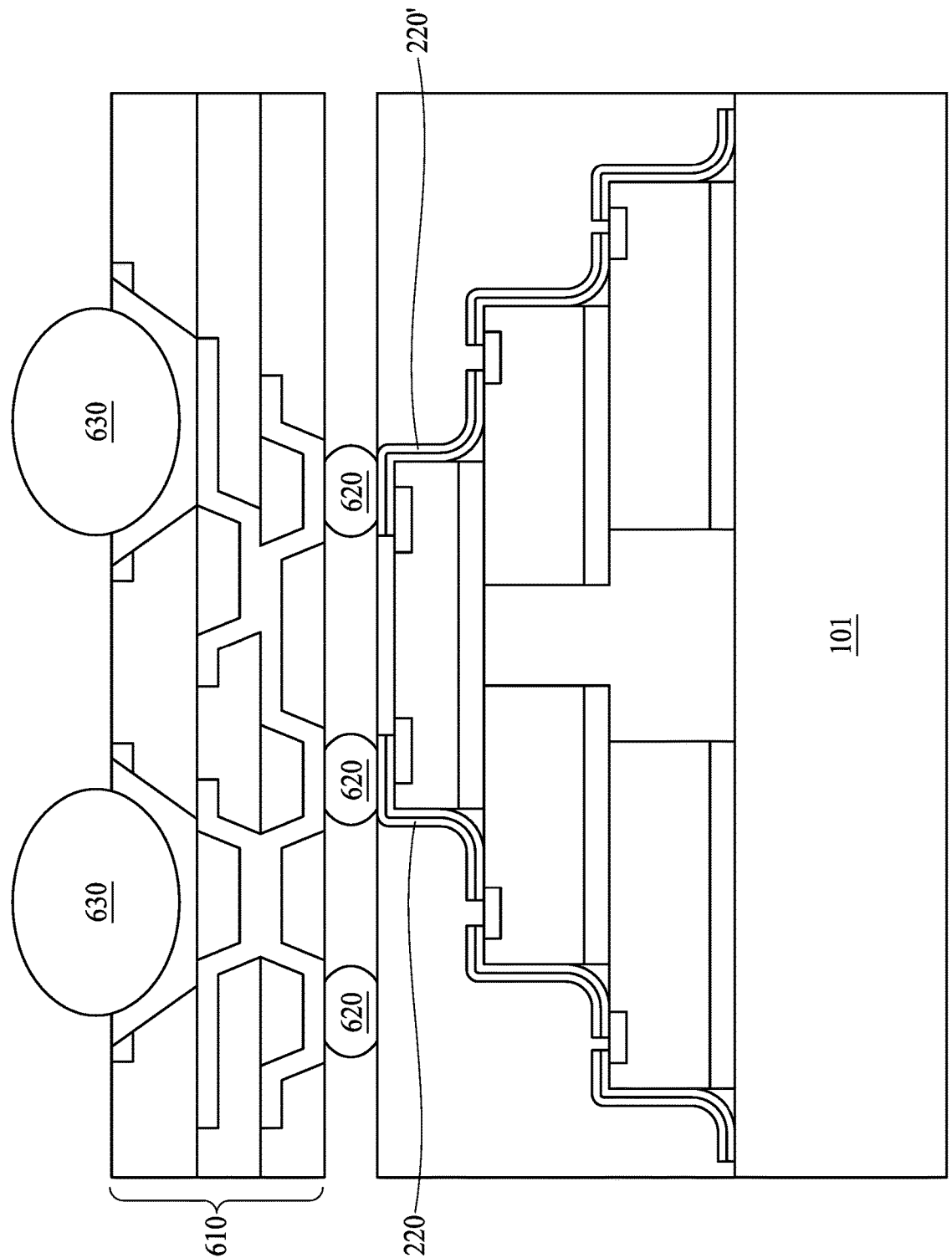

Referring to FIG. 7D, the interconnection structure 610 may be bonded to the stacked semiconductor devices (e.g., semiconductor devices 110, 110', 120, 120' and 130). The interconnection structure 610 may be bonded to the conductive layers 220 and 220' through the electrical contacts 620.

Figure 7E:
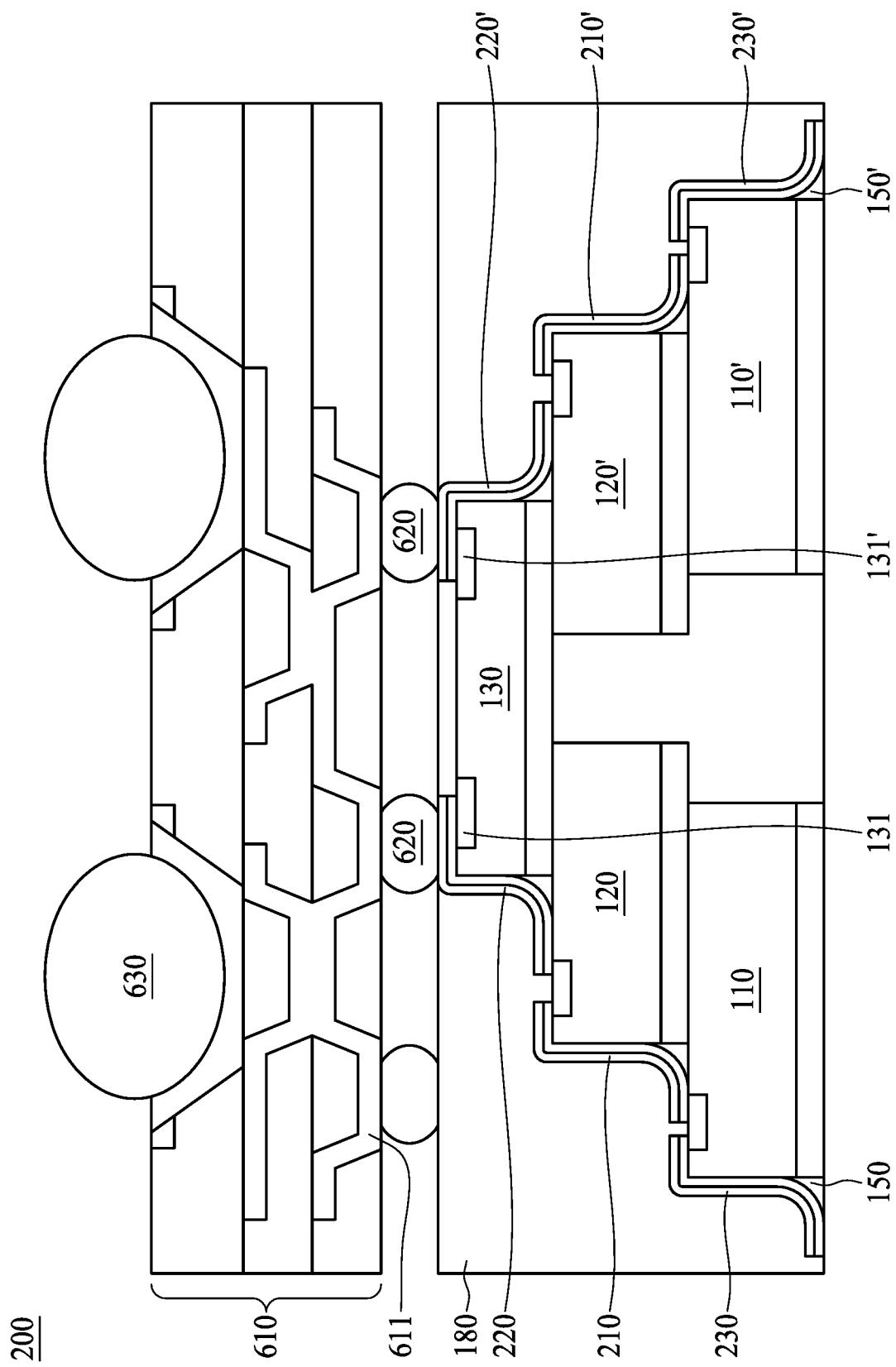

Referring to FIG. 7E, the carrier 101 may be removed to form the semiconductor device package 200.

Figure 8:
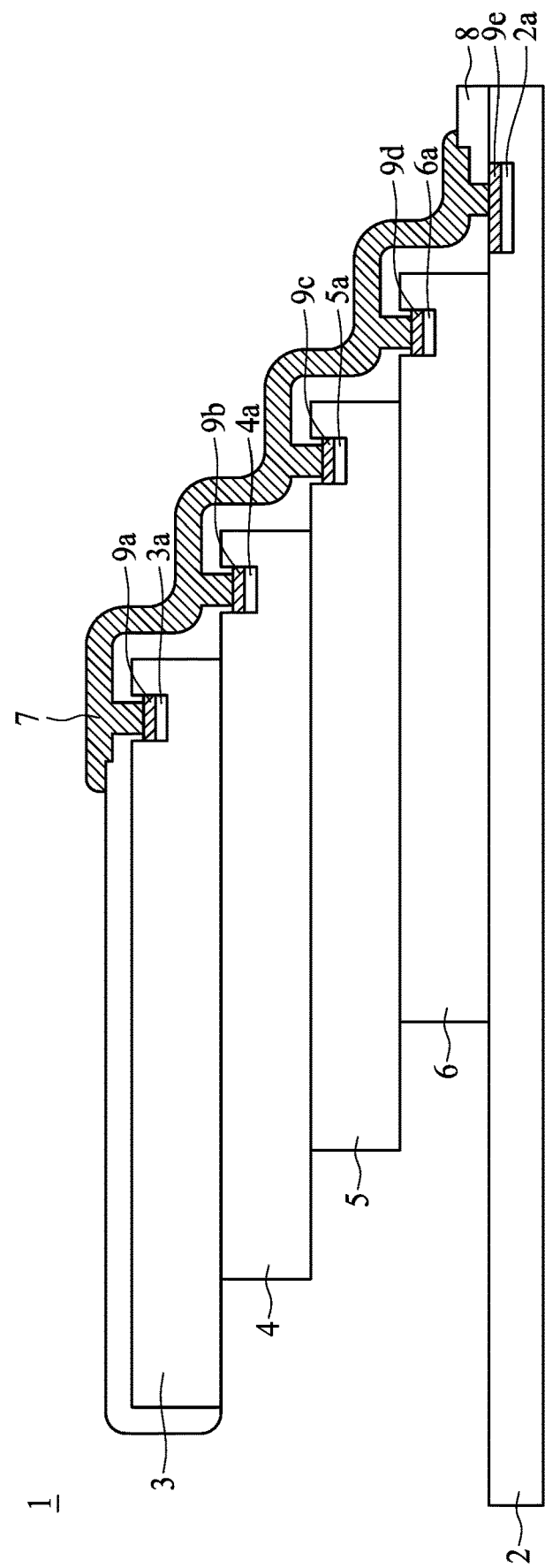
FIG. 8 illustrates a cross-sectional view of a semiconductor device package in accordance with some embodiments of the present disclosure.

FIG. 8 illustrates a cross-sectional view of a semiconductor device package 1 in accordance with some embodiments of the present disclosure. The semiconductor device package 1 may include a substrate 2, stacked semiconductor devices 3, 4, 5 and 6, a conductive layer 7 and an insulation layer 8. The semiconductor devices 3, 4, 5 and 6 may have conductive pads 3a, 4a, 5a and 6a, respectively. The substrate 2 may have a conductive pad 2a. The conductive layer 7 may electrically connect the conductive pads 2a, 3a, 4a, 5a and 6a. The conductive layer 7 may be spaced apart from the upper surfaces and the lateral surfaces of the semiconductor devices 3, 4, 5 and 6 by the insulation layer 8. The insulation layer 8 may be a continuous layer having through holes. Portions of the conductive layer 7 may be filled in the through holes of the insulation layer 8 to electrically connect to the conductive pads 2a, 3a, 4a, 5a and 6a. The semiconductor device package 1 may further include laser-blocking layers 9a, 9b, 9c and 9d disposed on the conductive pads 3a, 4a, 5a and 6a, respectively. In some embodiments, the laser-blocking layers 9a, 9b, 9c and/or 9d may be formed of or include nickel (Ni), lead (Pb), gold (Au), or a combination of two or more thereof. The conductive layer 7 may directly contact the laser-blocking layers 9a, 9b, 9c and 9d. The conductive layer 7 may be spaced apart from the conductive pads 3a, 4a, 5a and 6a by the laser-blocking layers 9a, 9b, 9c and 9d, respectively. The conductive layer 7 can electrically connect all of the conductive pads 3a, 4a, 5a and 6a of the semiconductor devices 3, 4, 5 and 6 to the conductive pad 2a of the substrate 2. The conductive layer 7 is relatively long and may be damaged in subsequent processes, which may increase the difficulty and the manufacturing costs of the rework process of the conductive layer 7.

In accordance with some embodiments illustrated in FIG. 1, the conductive layer 7 electrically connecting all of the semiconductor devices 3, 4, 5 and 6 to the substrate 2 can have a relatively great length. In the manufacturing process of the semiconductor device package 1, defects may be found in the semiconductor devices 3, 4, 5 and/or 6, abnormalities may occur in the formation process of the relatively long conductive layer 7, and the conductive layer 7 may also be damaged during the operation of encapsulation. Any or all of these situations may increase the difficulty as well as the manufacturing cost of the rework process of the damaged conductive layer 7. In addition, in accordance with some embodiments illustrated in FIG. 1, all of the semiconductor devices 3, 4, 5 and 6 can only be connected to the same signal source while sharing the same conductive layer 7. Moreover, the relatively great length of the conductive layer 7 may also occupy a relatively great elevational space, and the relatively great length of the conductive layer 7 may raise some issues (e.g., inductance effect when the package is working at a relatively high frequency).

Figure 9:
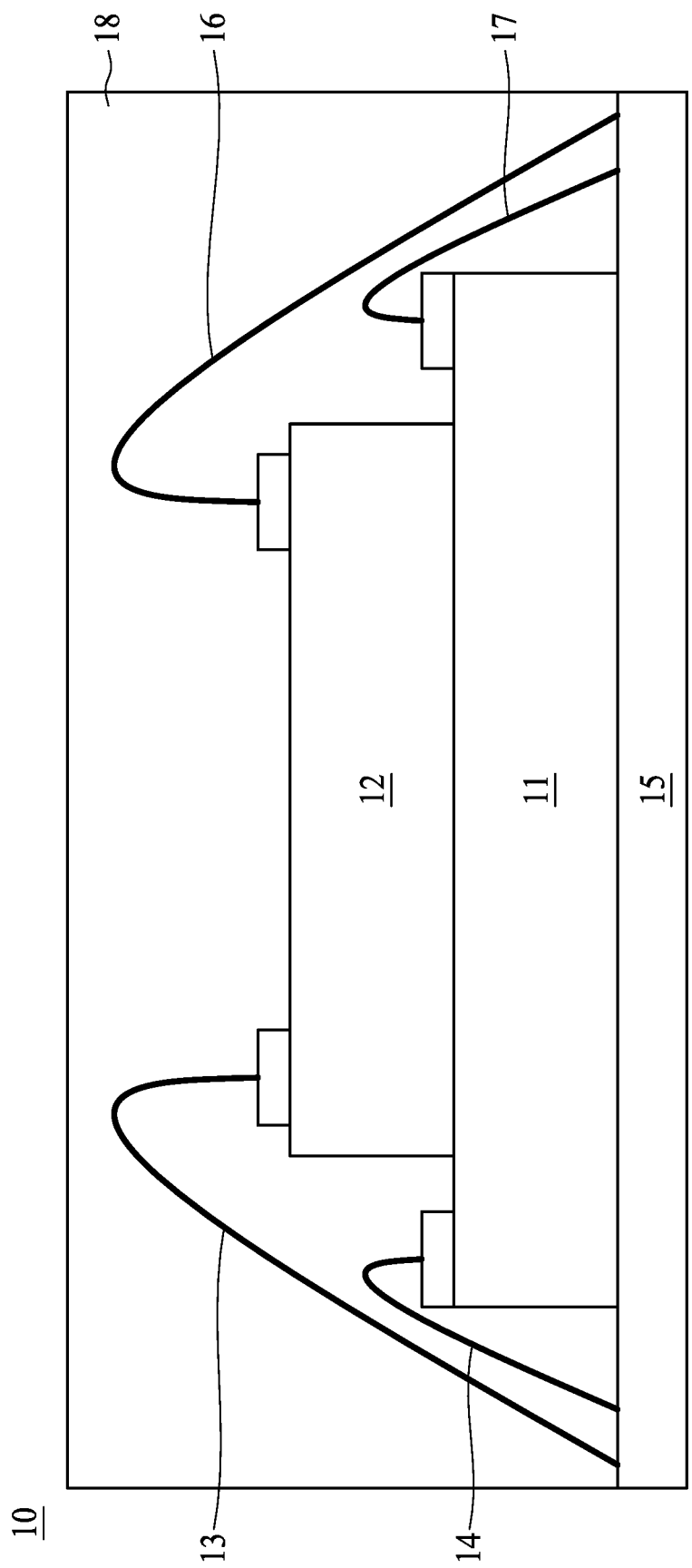
FIG. 9 illustrates a cross-sectional view of a semiconductor device package in accordance with some embodiments of the present disclosure.

FIG. 9 illustrates a cross-sectional view of a semiconductor device package 10 in accordance with some embodiments of the present disclosure. The semiconductor device package 10 may include a carrier 15, semiconductor devices 11 and 12, wires 13, 14, 16 and 17 and an encapsulation layer 18. The semiconductor devices 11 and 12 may be stacked on the carrier 15 and encapsulated by the encapsulation layer 18. The semiconductor device 11 and 12 may be electrically connected to the carrier 1 through the wires 13 and 14, respectively. The relatively great length of the wires 13, 14, 16 and 17 may occupy a relatively great elevational space (e.g., about 150 μm in height), which may cause an undesired inductance effect. Moreover, the wires 13, 14, 16 and 17 may also be damaged during the operation of encapsulation (e.g., the wires 13, 14, 16 and 17 may be broken by a relatively strong molding flow).

In some embodiments, multiple wires may be bonded to one single conductive pad of the semiconductor device 11 and/or the semiconductor device 12. However, due to the reduced size of the conductive pad, the first formed wire on the conductive pad may be damaged or broken by the later formed wire in the wire bonding process. In addition, the large diameter of the wires (e.g., about 15 μm to about 50 μm) may adversely affect the precision of the wiring bonding process of multiple wires on a single conductive pad.

Figure 10:
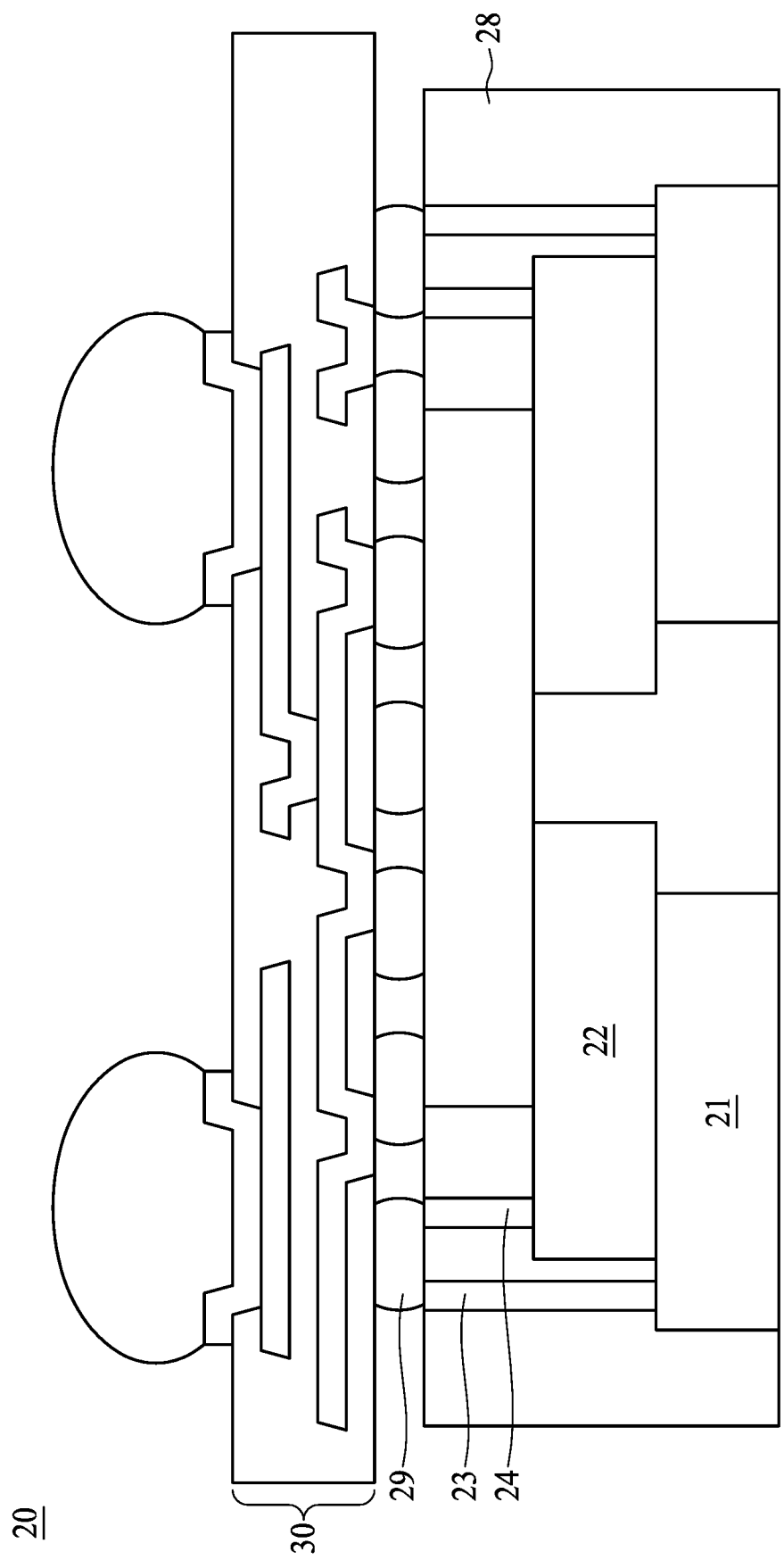
FIG. 10 illustrates a cross-sectional view of a semiconductor device package in accordance with some embodiments of the present disclosure.

FIG. 10 illustrates a cross-sectional view of a semiconductor device package 20 in accordance with some embodiments of the present disclosure. The semiconductor device package 20 may include semiconductor devices 21 and 22, conductive pillars 23 and 24, an encapsulation layer 28, electrical contacts 29 and an interconnection structure 30. The stacked semiconductor devices 21 and 22 may be electrically connected to the interconnection structure 30 through the conductive pillars 23 and 24, respectively. The conductive pillars 23 and 24 may be formed by, for example, forming through holes within the encapsulation layer 28 by a laser drilling process, followed by filling a conductive material in the through holes. The laser drilling process may suffer from low manufacturing yields. In addition, the relatively long conductive pillars 23 and 24 can be damaged during the operation of encapsulation (e.g., the conductive pillars may be broken by a relatively strong molding flow), which may greatly increase the difficulty as well as the manufacturing cost of the rework process of the conductive pillars. Moreover, it is difficult to control the uniformity of the heights of the conductive pillars, which may increase the difficulty of subsequent planarization processes.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as being from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a first semiconductor device having a first conductive pad;
   a first conductive layer disposed in direct contact with the first conductive pad and extending along a surface of the first conductive pad, the first conductive layer comprising:
      a first sub-layer in contact with the first conductive pad;
      a second sub-layer in contact with the first sub-layer; and
      a third sub-layer in contact with the second sub-layer; and
   a second conductive layer disposed in direct contact with the first conductive pad and spaced apart from the first conductive layer.

2. The semiconductor device package of claim 1, further comprising:
   a second semiconductor device stacked on the first semiconductor device, a first portion of a surface of the first semiconductor device and a first portion of a surface of the second semiconductor device defining a corner; and
a supporting structure disposed in the corner.

3. The semiconductor device package of claim 1, further comprising:
a second semiconductor device stacked on the first semiconductor device, wherein the second semiconductor device has a first conductive pad, and the second conductive layer is in direct contact with the first conductive pad of the second semiconductor device.

4. The semiconductor device package of claim 1, wherein the first conductive layer covers a first portion of the first conductive pad and the second conductive layer covers a second portion of the first conductive pad, and wherein the first portion of the first conductive pad is opposite to the second portion of the first conductive pad.

5. The semiconductor device package of claim 1, wherein the first conductive layer extends along a direction parallel to the surface of the first conductive pad.

6. The semiconductor device package of claim 2, wherein the second conductive layer is in direct contact with the supporting structure and a second portion of the surface of the first semiconductor device.

7. The semiconductor device package of claim 2, wherein the second conductive layer is in direct contact with the supporting structure and a second portion of the surface of the second semiconductor device.

8. The semiconductor device package of claim 2, wherein the supporting structure is in contact with the first portion of the surface of the first semiconductor device and the first portion of the surface of the second semiconductor device.

9. The semiconductor device package of claim 3, wherein the second semiconductor device has a first surface and a second surface substantially perpendicular to the first surface, and the second conductive layer is in direct contact with the first surface and the second surface of the second semiconductor device.

10. The semiconductor device package of claim 4, wherein the first conductive pad has a first surface and a second surface substantially perpendicular to the first surface, and the first conductive layer is in direct contact with the first surface and the second surface of the first conductive pad.

11. A semiconductor device package, comprising:
a first semiconductor device having a first surface;
a second semiconductor device stacked on the first semiconductor device, the second semiconductor device having a first surface substantially perpendicular to the first surface of the first semiconductor device, and a second surface at an elevation different from an elevation of the first surface of the first semiconductor device;
a first conductive layer disposed in direct contact with the first surface of the first semiconductor device, the first surface of the second semiconductor device, and the second surface of the second semiconductor device; and
a second conductive layer disposed in direct contact with the second surface of the second semiconductor device.

12. The semiconductor device package of claim 11, wherein the first semiconductor device has a conductive pad, and the first conductive layer is in direct contact with the conductive pad of the first semiconductor device.

13. The semiconductor device package of claim 11, wherein the second conductive layer is spaced apart from the first conductive layer.

14. The semiconductor device package of claim 11, further comprising:
a third semiconductor device stacked on the second semiconductor device, the third semiconductor device having a first surface substantially perpendicular to the second surface of the second semiconductor device, the second conductive layer directly contacting the first surface of the third semiconductor device.

15. The semiconductor device package of claim 11, wherein the second semiconductor device has a conductive pad, a first portion of the conductive pad in direct contact with the first conductive layer is spaced apart from a second portion of the conductive pad in direct contact with the second conductive layer.

16. The semiconductor device package of claim 11, further comprising:
a supporting structure disposed in direct contact with the first surface of the second semiconductor device, wherein an interface between the supporting structure and the second semiconductor device and an interface between the first conductive layer and the second semiconductor device are continuous.

17. The semiconductor device package of claim 11, wherein the first conductive layer comprises:
a seed layer in contact with the first surface of the first semiconductor device.

18. The semiconductor device package of claim 12, further comprising:
an encapsulation layer disposed on the first semiconductor device, the second semiconductor device and first conductive layer, wherein the encapsulation layer is in direct contact with the conductive pad of the first semiconductor device.

19. The semiconductor device package of claim 14, wherein the third semiconductor device has a second surface at an elevation different from an elevation of the second surface of the second semiconductor device, and the second conductive layer is in direct contact with the second surface of the third semiconductor device.

20. A semiconductor device package, comprising:
a first semiconductor device having a first surface;
a second semiconductor device stacked on the first semiconductor device, the second semiconductor device having a first surface substantially perpendicular to the first surface of the first semiconductor device, and a second surface at an elevation different from an elevation of the first surface of the first semiconductor device; and
a first conductive layer disposed in direct contact with the first surface of the first semiconductor device, the first surface of the second semiconductor device, and the second surface of the second semiconductor device, wherein the first conductive layer comprises a seed layer in contact with the first surface of the first semiconductor device.

* * * * *